United States Patent
Love et al.

(10) Patent No.: US 12,424,669 B2
(45) Date of Patent: Sep. 23, 2025

(54) METHODS FOR BATTERY INTERNAL SHORT CIRCUIT TRIGGER AND IMPROVED PERFORMANCE BY TEMPERATURE GRADIENTS

(71) Applicant: The Government of the United States of America, as represented by the Secretary of the Navy, Arlington, VA (US)

(72) Inventors: Corey T. Love, Alexandria, VA (US); Rachel E. Carter, Alexandria, VA (US); Robert W Atkinson, Alexandria, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 1312 days.

(21) Appl. No.: 16/505,572

(22) Filed: Jul. 8, 2019

(65) Prior Publication Data

US 2020/0014079 A1   Jan. 9, 2020

Related U.S. Application Data

(60) Provisional application No. 62/694,672, filed on Jul. 6, 2018.

(51) Int. Cl.
*H01M 10/42* (2006.01)
*G01R 31/385* (2019.01)
*H01M 10/0525* (2010.01)
*H01M 10/44* (2006.01)
*H01M 10/48* (2006.01)

(52) U.S. Cl.
CPC .... *H01M 10/4235* (2013.01); *G01R 31/3865* (2019.01); *H01M 10/0525* (2013.01); *H01M 10/4285* (2013.01); *H01M 10/44* (2013.01); *H01M 10/48* (2013.01)

(58) Field of Classification Search
CPC .......... H01M 10/4235; H01M 10/446; H01M 10/613; H01M 10/615; H01M 10/0525; H01M 10/052; H01M 10/4285; H01M 10/44; H01M 10/48; H01M 10/058; G01R 31/3865

See application file for complete search history.

(56) References Cited

U.S. PATENT DOCUMENTS

| | | | |
|---|---|---|---|
| 2009/0325016 A1 | 12/2009 | Yamashita et al. | |
| 2013/0127423 A1* | 5/2013 | Liang | H02J 7/0025 |
| | | | 429/153 |
| 2017/0207378 A1 | 7/2017 | Kang et al. | |
| 2017/0214106 A1* | 7/2017 | Johnson | H01M 10/399 |

FOREIGN PATENT DOCUMENTS

| | | | |
|---|---|---|---|
| JP | 60-243979 | 12/1985 | |
| JP | 2001-015138 A | 1/2001 | |
| JP | 5988172 B2 | 8/2016 | |
| JP | 5988172 | * 9/2016 | ............ H01M 14/00 |
| KR | 101120723 B1 | 9/2010 | |
| WO | 2012/140856 A1 | 10/2012 | |

OTHER PUBLICATIONS

Aryanfar et al., "Thermal relaxation of lithium dendrites" Phys. Chem.Chem.Phys., 2015, 17, 8000.
Carter et al., "Modulation of Lithium Plating in Li-Ion Batteries with External Thermal Gradient" ACS Appl. Mater. Interfaces 2018, 10, 26328-26334.
Doughty. "The Landscape of Thermal Runaway Propagation Testing", Safer Li-ion Batteries by Preventing Thermal Runaway Propagation? (Mar. 9, 2018).
Goldenfeld. "Dynamcis of Dendritic Growth" J. Power Source, 26 (1989) 121-128.
Hasan et al., "High Thermal Gradient in Thermoelectrochemical Cells by Insertion of a Poly(Vinylidene Fluoride) Membrane" Scientific Reports, 6, 29328 (2016).
Lamb et al., "Internal Cell Failure Initiation" Battery Safety Council Forum 3, (Jan. 12, 2017).
Love et al., "Observation of Lithium Dendrites at Ambient Temperature and Below" ECS Electrochemistry Letters, 4(2) A24-A27 (2015).
Love, "Perspective on the Mechanical Interaction Between Lithium Dendrites and Polymer Separators at Low Temperature" J. Electrochem. Energy Conversion and Storage, 13, 031004 (2016).
Love et al., "Lithium-Ion Cell Fault Detection by Single-Point Impedance Diagnostic and Degradation Mechanism Validation for Series-Wired Batteries Cycled at 0° C" Energies 2018, 11, 834.
Love et al., "Innovating Safe Lithium-Ion Batteries Through Basic to Applied Research"J. Electrochem. Energy Conversion and Storage, 15, 011006 (Feb. 2018).

(Continued)

*Primary Examiner* — Raymond Alejandro
(74) *Attorney, Agent, or Firm* — US Naval Research Laboratory; Joseph T. Grunkemeyer

(57) ABSTRACT

A method of: providing an electrochemical energy storage device having a first electrode and a second electrode; and simultaneously: a) maintaining the first electrode at a first temperature; b) maintaining the second electrode at a second temperature; and c) charging or discharging the device. The coolest portion of the second electrode is at least 1° C. warmer than the warmest portion of the first electrode.

4 Claims, 12 Drawing Sheets

(56) References Cited

OTHER PUBLICATIONS

Mistry et al., "Electrolyte Confinement Alters Lithium Electrodeposition" ACS Energy Lett. 2019, 4, 156-162.
Steele et al., "Battery Testing" FY 2017 Annual Progress Report, Adv. Batteries R&D (Sep. 2017).
Troxler et al., "The effect of thermal gradients on the performance of lithium-ion batteries" Journal of Power Sources 247 (2014) 1018-1025.
Search Report and Written Opinion in PCT/US2019/040887 (Oct. 30, 2019).
Extended European Search Report in EP19830195.5 (Feb. 25, 2022).

* cited by examiner

METHODS FOR BATTERY INTERNAL SHORT CIRCUIT TRIGGER AND IMPROVED PERFORMANCE BY TEMPERATURE GRADIENTS

This application claims the benefit of U.S. Provisional Application No. 62/694,672, filed on Jul. 6, 2019. The provisional application and all other publications and patent documents referred to throughout this nonprovisional application are incorporated herein by reference.

TECHNICAL FIELD

The present disclosure is generally related to thermal treatment of batteries.

DESCRIPTION OF RELATED ART

Lithium-based, rechargeable batteries have enjoyed considerable commercial success since their introduction for rechargeable, portable applications that require a combination of high energy density, light weight, and rapid charging capability. The continuously rising demands for mobile energy storage necessitate improvements in energy density, cost-effectiveness, and recharge times while still maintaining safe and durable, long-term cycling characteristics. Despite its commercial success to date, replacing graphite with lithium metal in the anode of $Li^+$-ion batteries can further enable promising new battery chemistries as well as new applications.

Lithium metal anodes in rechargeable batteries promise high specific capacity (3860 mAh $g^{-1}$), light weight, and the lowest electrochemical potential (−3.04 V vs. SHE) (1, 2), but are currently hindered by recharge capability. In the ideal case for a rechargeable battery with a lithium metal anode, Li would be plated at the cell anode in densely-packed, uniform deposits that could be easily stripped, with complete reversibility, for re-intercalation into the cell cathode. Plating and stripping lithium with low overpotentials minimizes energy efficiency losses and diffusion resistances. The latter is critical because it has implications for the future stability of the cell; plating lithium with high overpotentials evinces that $Li^+$-ion diffusion is poor, which will lead to unwanted, high-aspect ratio Li plating morphologies (3). Alternatively, low overpotentials are suggestive of facile $Li^+$-ion diffusion that results in compact, planar lithium plating morphologies that are less susceptible to detrimental reactions with the electrolyte. Though Li metal promises an order of magnitude capacity enhancement over current state-of-the-art graphite at the negative electrode, deployment will require overcoming significant challenges. The practically observed scenario for lithium plating and stripping does not reproducibly match the ideal case described above. Due to its high reactivity, lithium metal is unstable in the electrolyte, inevitably forming a solid electrolyte interphase (SEI) through a chemical reaction that passivates the metal surface at the expense of electrolyte salt and the lithium metal anode itself (4). Additionally, lithium plating deposits are typically porous (5-8), causing drastic volumetric expansion and contraction during plating and stripping. The porosity of these deposits increases surface area, which predisposes the electrodes to continual, detrimental, electrode-electrolyte reactions (9). This irreversibly consumes electrodes and electrolyte, reducing capacity and forming undesirable surface deposits of electrochemically inactive lithium at the electrode-electrolyte interface that hinder charge transfer (10, 11). Another notorious challenge is that lithium has a propensity to electrodeposit in high-aspect ratio morphologies, such as dendrites, during repeated plating/stripping, which have the potential to cause internal short circuits and initiate the thermal runaway reaction (12).

A number of promising strategies have been presented for alleviating these effects and bringing safe, rechargeable, lithium metal batteries closer to reality. One approach involves using three-dimensional and conductive host materials like carbon, nickel, or other materials that reduce volumetric fluctuations, mechanically stabilize SEI formations, and limit Li reactions with the electrolyte (5, 13-18). Electrode-electrolyte reactions have been reduced by applying chemically-stable coatings prior to cycling to form an "artificial" SEI, protecting lithium metal from corrosion by the electrolyte and potentially suppressing dendrite growth (19, 20). Coatings have also been engineered to homogenize electronic conductivity throughout the electrode for more uniform lithium plating (21). Another effective strategy for stabilizing lithium metal batteries involves electrolyte modifications that entail selections for additives, solvents, or salt concentrations. The motivation for these efforts can be to tune $Li+$-ion flux or the metal interactions with the electrolyte, and can also include promoting more benign plating morphologies or increasing plating deposit densities (12, 22-24). Separator polymers have also been crosslinked with ceramics in an attempt to mechanically stifle dendrite growth (25). Materials design and cell component selection has dominated efforts in the literature to harness lithium metal for next-generation batteries. Separate from these materials approaches are operational protocols for safe and reproducible long-term cycling. One example of this is pulse charging, which homogenizes the ion concentration gradients between stripping and plating electrodes to diminish dendrite nucleation while minimally influencing charging times (7, 26-28).

Stripping lithium from a warm electrode (40° C.) and plating on a cold electrode (0° C.) reproduces conditions known to result in high-aspect ratio lithium plating deposits, such as dendrites. This concept was demonstrated in graphite/lithium nickel manganese cobalt oxide (NMC) coin cells (30). A linearly decreasing temperature across the electrolyte (approaching the cold negative electrode) reduces the ionic mobility in the electrolyte and forms a $Li^+$-ion concentration gradient; this concentration gradient causes Li metal to preferentially plate on the negative electrode surface before the $Li^+$-ions can intercalate into the cold electrode. Though there is no graphite host nor intercalation process occurring at the negative electrode when lithium metal is used in place of graphite, the recent modeling work by Mukherjee et al. on lithium metal symmetric cells supports the conclusion that these adverse conditions will result in high-aspect ratio lithium plating because of these $Li^+$-ion concentration gradients that arise from the difference in temperature across the electrolyte (31).

BRIEF SUMMARY

Disclosed is a method comprising: providing an electrochemical energy storage device comprising a first electrode and a second electrode; and simultaneously: a) maintaining the first electrode and a first temperature; b) maintaining the second electrode at a second temperature; and c) charging or discharging the device. The coolest portion of the second electrode is at least 1° C. warmer than the warmest portion of the first electrode.

BRIEF DESCRIPTION OF THE DRAWINGS

A more complete appreciation will be readily obtained by reference to the following Description of the Example Embodiments and the accompanying drawings.

FIG. 1A shows isothermal 20° C., FIG. 1B shows positive thermal gradient (40° C. negative electrode, 0° C. positive electrode), FIG. 1C shows negative thermal gradient (0° C. negative electrode, 40° C. positive electrode), and FIG. 1D shows isothermal 0° C. The arrow indicates the direction of Li$^+$-ion diffusion in the first plating.

FIG. 3E shows high frequency resistance and FIG. 3F shows interfacial resistance evolutions with cycle number. Figure scaling in FIGS. 3A-D omits inductance effects at high frequency of spectra. Spectra were measured from 300,000 to 0.1 Hz with 0.1 V amplitude.

DETAILED DESCRIPTION OF EXAMPLE EMBODIMENTS

Figure 1A:
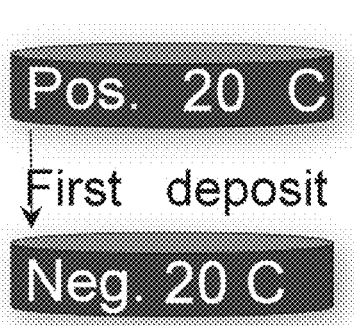
FIG. 1A-1D show schematic representations of the electrode temperatures for the symmetric lithium metal coin cells in the thermal conditions tested.

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Disclosed herein is a method to create dendritic lithium metal structures to form internal short circuits in batteries to simulate real world failures for safety testing and evaluation. Generally, these lithium structures should be avoided and are detrimental to battery safety leading to dangerous thermal runaway reactions. However, it is necessary from a safety testing and evaluation standpoint to initiate such a failure according to multiple DoD, Navy, UN, SAE, UL, etc. safety standards. The US Navy tests batteries to failure according to Technical Manual 9310. Current methods to induce short circuits do not represent real world, field failures. "Short circuit" tests are often performed by attaching a cartridge heater to a battery cell, raising the cells temperature above the thermal limits of the cell to initiate thermal runaway. This is not representative of failures in the field. The disclosed method serves as a "trigger mechanism" by which internal short circuits could be created for safety standard testing applications. The ability to repeatability initiate thermal runaway failures induced by lithium dendrites is considered the "holy grail" of lithium-ion battery safety research.

Supercooling is used to drive solidification processes in the electrochemical environment. In the battery example, a thermal gradient is imposed across the electrodes to achieve electrodeposition at potentials above the thermodynamic standard reaction potentials. This process, known as thermogalvanics, allows for localized dendrite nucleation without altering the chemistry/electrochemistry of the host electrodes. The effects of the magnitude and positioning of the thermal gradient were first explored in an experimental cell where hot and cold thermal fluids were circulated through tubes to simulate electrodes. The method is then used in practice on fabricated coin cells (CR2032) between heated and cooled thermal plates. The structures that cause internal short circuits, may form rapidly in environments with slow mass transport and charge transfer. This method exaggerates these effects by creating a thermal gradient across the two electrodes where the low temperature electrode serves as the initiation site for lithium dendrites.

In general, the method can be performed using any electrochemical energy storage device comprising a first electrode and a second electrode, including but not limited to, batteries, lithium ion batteries, and lithium metal batteries. The designation of first electrode and second electrode to an anode or cathode depends on which electrode is kept cooler. As used herein, the first electrode is maintained at a cooler, first temperature, and the second electrode is maintained at warmer, second temperature. The two temperatures are maintained such that the coolest portion of the second electrode is at least 1° C. warmer than the warmest portion of the first electrode. The first and second temperatures may refer to the average temperature of the electrode, to the most extreme temperature across the electrode, or to the temperature of the device used to maintain the electrode temperature. While the electrode temperatures are maintained, the device is simultaneously charged or discharged.

The two electrodes may generally be located in physically distinct locations in order to maintain the temperature differential. This differs from electrodes that are wrapped together in a spiral or that are interdigitated. It also differs from maintaining a warmer or cooler area in both electrodes together. In the present method, the second electrode is entirely cooler than the first electrode at all points by at least 1° C. This temperature difference may be up to 5° C., 10° C., 20° C., 30° C., 40° C., or 50° C.

Three variants of the method may be used. In a first variant, the anode is the cooler, first electrode, and the temperatures are maintained while charging the battery. The temperature of the anode may be, for example, −10° C. to 5° C. As mentioned above, this may produce metal or lithium plating on the anode. The method may be performed until the plating grows to form an internal electrical short to the cathode. This need not be completed in a single charging cycle. The method of forming a short by charging with a cooler anode may be interrupted by discharge cycles or dormant time.

In a second variant, the cathode is the cooler, first electrode. The anode already comprises metal or lithium plating. The method may be performed during charging and/or discharging to convert a portion of the plating to metal ions. This variant is essentially the reverse of the first variant.

In a third variant, again the cathode is the cooler, first electrode. No plating is required on the anode, but the anode comprises lithium metal as opposed to an all carbon anode. By keeping the cathode cooler, both the capacity and cycleability of the anode may be improved.

Materials and coin cell fabrication—Symmetric lithium metal cells were constructed in CR 2032 coin cells using commercial, metallic, Li chip electrodes and prepared in an Ar-filled glovebox. The Li electrodes (MTI Corporation, EQ-Lib-LiC60-300) were 16 mm in diameter (2.0 $cm^2$ geometric area), 0.6 mm thick, and used as received. Two symmetric metal electrodes were isolated by two Entek Gold LP UHMWPE separators (19.4 μm thickness, 37% porosity) (33) that were punched to 17 mm diameter and vacuum-dried overnight at 50° C. before transfer to the glovebox. Separators were wet with 90 μL of 1 M bis(trifluoromethane)sulfonimide lithium salt (LiTFSI, 99.95% trace metals basis) in a 1:1 volume ratio of 1,3-dioxolane (34) and 1,2-dimethoxyethane (DME) with 1 wt % lithium nitrate ($LiNO_3$); all electrolyte salts and solvents were obtained from Sigma-Aldrich. A high volume of electrolyte was used to limit variability between cells during cycling and to reduce the deleterious effects of electrolyte consumption and dry-out (35). Coin cells were crimped with a hydraulic MTI crimper to 750 psi.

Electrochemical measurements—All cells were initially cycled at ambient temperature prior to cycling in the respective thermal condition. This initial formation entailed one plating/stripping cycle at 0.75 mA $cm^{-2}$ to a capacity of 4.5 mAh $cm^{-2}$. Immediately following formation, cells were placed in Tenney environmental chambers to thermally soak for 2 hr to reach thermal equilibrium prior to electrochemical cycling. The applied external thermal gradient was achieved by holding cells between thermally conductive metal plates outfitted with Cu contact leads and thermocouples and internally plumbed for fluid circulation for thermal control by a fluid recirculating bath; the plumbed metal plates are detailed schematically in prior work (30). One of the metal plates was heated with recirculated fluid from a 45° C. bath while the other plate was circulated with −10° C. fluid, resulting in measured coin cell skin temperatures of ∼40° C. and ∼0° C., respectively, that were imposed at opposite electrodes. Opposing electrode temperatures of 0° C. and 40° C. were selected for the thermal gradient-controlled cells because these temperatures are within the bounds of normal battery operation to minimize degradation that may result from more extreme temperatures (36), while also maintaining a significant thermal gradient magnitude and a near-ambient average of the two electrode temperatures. The thermal conditions applied in this work, with coin cell skin temperatures and magnitudes of the thermal gradients across the cell from negative to positive electrode, are summarized in Table 1. The cell thermal control conditions are also illustrated schematically in FIG. 1; the arrow indicates the direction of $Li^+$ ion diffusion in the first electrodeposition after the formation cycle. In this work, one set of cells was oriented with heated negative electrodes and cooled positive electrodes (FIG. 1B, +ΔT: 40° C.-0° C.) while another set of cells was in the opposite orientation with cooled negative electrodes and heated positive electrodes (FIG. 1C, −ΔT: 0° C.-40° C.). The final two sets of cells were maintained with isothermal electrode thermal control during electrochemical cycling: at 20° C. and 0° C. (FIGS. 1A and 1D, respectively).

Cells were characterized by cycling at 1.5 mA $cm^{-2}$ to a capacity of 3.0 mAh $cm^{-2}$ with a Princeton Applied Research system. Electrochemical impedance spectroscopy was measured from 300,000 to 0.1 Hz with 0.1 V amplitude. High frequency resistance (HFR) in this study refers to the intersection of the impedance spectra with the real axis at high frequency; interfacial resistance refers to the intersection at low frequency for the high-frequency arc. Rate capability was measured for cells after the initial formation cycle by varying current density for five cycles each from 0.5, 1.0, 2.0, 5.0, to 0.5 mA $cm^{-2}$ and capacity from 1.0, 2.0, 4.0, 10.0, to 1.0 mAh $cm^{-2}$, respectively. Voltage hysteresis for a given cycle is the sum of the absolute value of cell voltage.

TABLE 1

Summary of symmetric lithium coin cell skin temperatures and thermal gradients for the applied thermal conditions
Electrode Temperature (° C.)

| Condition | Negative | Positive | ΔT (° C.) |
|---|---|---|---|
| 20° C. | 20 | 20 | 0 |
| +ΔT | 40 | 0 | +40 |
| −ΔT | 0 | 40 | −40 |
| 0° C. | 0 | 0 | 0 |

Electrode characterization—The coin cells were deconstructed for electrode characterization at different stages during electrochemical cycling or at the completion of cycling. A hydraulic crimper installed with disassembly dies (MTI Corporation) was used to deconstruct the coin cells within the glovebox. The cycled electrodes were harvested and immediately photographed before they were mounted between quartz windows in an in-house developed optical cell for optical microscopy imaging, described in a prior work (37). Optical micrographs were collected using a Navitar Zoom 6000 lens apparatus with a Luminera Infinity 2, digital camera with a 2.0× lens attachment. Electrodes were imaged at 1.4× and 9.0× magnification with depths of field of 0.95 and 0.10 mm and resolution limits of 14.5 and 4.70 µm, respectively. A Multi-Position Fiber Optic Illuminator System was used to consistently illuminate all samples.

Lithium metal negative electrodes were prepared in the glovebox for X-ray diffraction (XRD) measurements. The electrodes were first rinsed with 1,3-dioxolane to remove electrolyte salts, dried, and then mounted to a glass microslide to keep flat and sealed with Kapton tape to limit exposure to air and moisture during XRD scans. All samples were fixed inside an air-sensitive, X-ray transparent sample holder (Bruker) within the glovebox before transfer to the diffractometer. Symmetric θ-2θ diffraction patterns were collected using a Bruker D8 Advance diffractometer with Cu Kα radiation ($\lambda$=0.1541874 nm, 40 kV, 40 mA) by scanning from 20° to 92° in 2θ with 1 s steps of 0.02°/step while the sample was rotated at 25 rpm.

The magnitude of voltage hysteresis was used as a metric for cycling stability and rate capability of lithium metal. Electroplating lithium with a positive thermal gradient (40° C. negative electrode, 0° C. positive electrode) in the first plating favors stable, extended-duration cycling with the lowest voltage hysteresis of all thermal conditions studied in this work, including isothermal 20° C. (ambient). During long-term cycling at 1.5 mA cm$^{-2}$ to a capacity of 3.0 mAh cm$^{-2}$, shown in FIG. 2A, cells with a positive thermal gradient have the lowest cell voltages by cycle 20 that persist through the duration of the 100-cycle test. Low cell voltages indicate facile plating and stripping, related to favorable kinetics and diffusion (3). Maintaining low cell voltages during plating/stripping cycling promotes preferential, compact, and planar Li deposition that facilitates stable, long-term cycling.

The reverse of this thermal condition, a negative thermal gradient (−ΔT: 0° C. negative electrode, 40° C. positive electrode), causes rapid degradation beginning at cycle 15, highly unstable cell voltage profiles characteristic of dendritic growth by cycle 22, large cell voltages, and termination of cycling by an internal short apparent from a drastic reduction in cell voltage (12) at cycle 46. This behavior is similar to that observed for a negative thermal gradient in graphite|NMC cells in prior work (30). Being symmetrical cells with lithium metal at both electrodes, the respective temperatures of the stripping and plating electrodes will reverse cyclically during cycling due to the reversal of the current for lithium plating and stripping. Each of the thermal gradient controlled cells will experience cold stripping/warm plating and warm stripping/cold plating, repeatedly. Therefore, the only difference between these two cells of opposite thermal gradient control is the directionality of the thermal gradient for the very first plating cycle.

The negative thermal gradient (FIG. 1C) requires stripping lithium from a warm electrode (40° C.) and plating on a cold electrode (0° C.) in the first electrodeposition, reproducing conditions known to result in high-aspect ratio lithium plating deposits. This thermal condition causes more rapidly decreasing Li$^+$-ion concentration with proximity to the cold anode compared to an isothermal cell, predisposing lithium to high-aspect ratio electrodeposition during the first plating. This exacerbates future plating and stripping. A non-uniform electrode surface with higher surface area not only predisposes the electrode to more reactions with the electrolyte (3, 38), it is also inherently more prone to concentration gradients when the current is reversed and lithium is stripped from this cold electrode to plate on the warm, opposing electrode. This in turn will cause uneven lithium stripping and exacerbate concentration gradients of lithium ions in the electrolyte on the subsequent stripping cycle. These processes compound as cycling continues, further reducing electrode uniformity, increasing electrode-electrolyte reactions, and decreasing voltage stability until the cell forms an internal short circuit, occurring at cycle 46 in FIG. 2A.

Figure 1B:
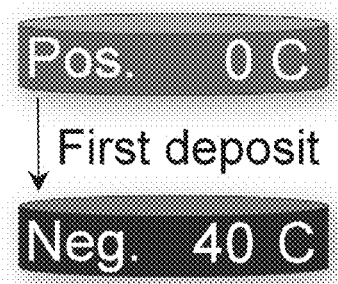
Figure 1C:
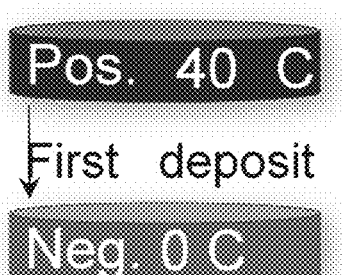
Figure 1D:
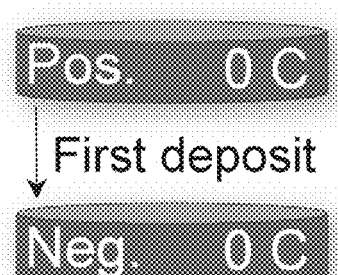

Ideal lithium plating conditions are present for the first Li electrodeposition with a positive thermal gradient (FIG. 1B, 0° C. positive electrode, 40° C. negative electrode). This thermal condition promotes the highest electrolyte concentration and salt diffusivity nearing the plating electrode, decreasing electrolyte confinement (31); this increases Li plating uniformity and decreases electrode surface roughness that will diminish detrimental electrode-electrolyte reactions that consume electrolyte and the freshly deposited Li. A higher electrode surface temperature also increases Li$^+$-ion surface diffusion that suppresses dendritic growth (32). When the current is reversed following the completion of the first electrodeposition, freshly deposited Li is inherently easier to strip than the bulk electrode because its SEI is newly formed and is relatively thin, and the plating deposit is absent of a native surface layer (39). For this reason, electrodepositing lithium to form a more compact, uniform layer on the electrode in the first deposit facilitates the subsequent stripping after current reversal, despite the exposure to adverse plating conditions (stripping electrode is now warm, plating electrode is cold) during stripping. High uniformity in the first electrodeposition promotes the long-term, stable cycling observed in FIG. 2A for the positive thermal gradient compared to all other thermal conditions.

Figure 2A:
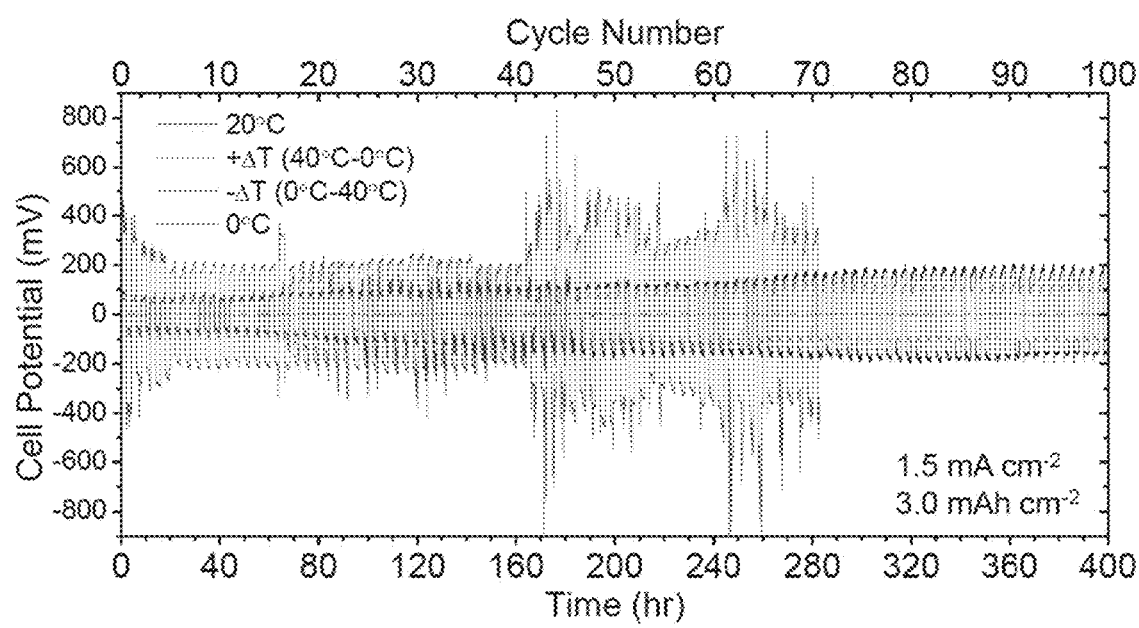
FIG. 2A shows long-term cycling of symmetric lithium metal coin cells at a current density of 1.5 mA cm$^{-2}$ to a capacity of 3.0 mAh cm$^{-2}$ with varying external thermal control.
Figures 2B, 2C, 2D, 2E, 2F:
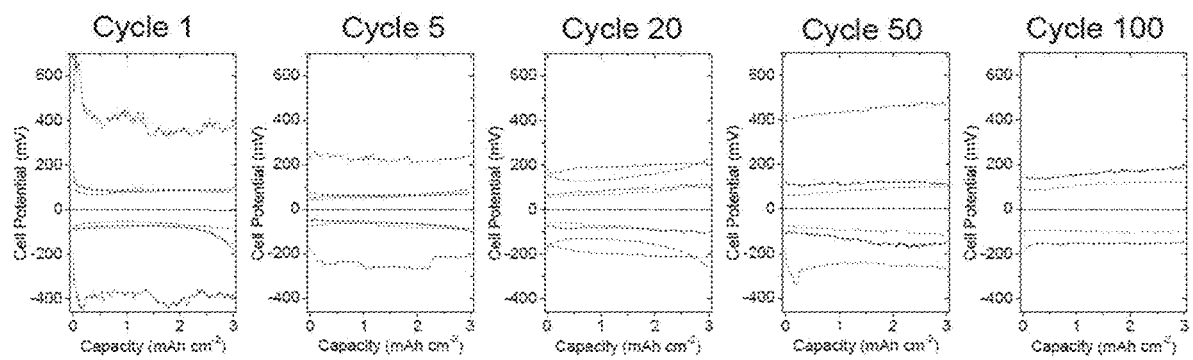
FIGS. 2B-F show plating and stripping profiles of cycle 1 (FIG. 2B), cycle 5 (FIG. 2C), cycle 20 (FIG. 2D), cycle 50 (FIG. 2E), and cycle 100 (FIG. 2F).

Though the positive thermal gradient is most favorable for long-term cycling, its voltage profiles are nearly indistinguishable from other thermal conditions in the first 5 plating/stripping cycles, shown in FIG. 2A and FIG. 2B. The disadvantage of positive thermal gradient control is that this subjects the positive electrode (initial stripping electrode) to low temperature. This may explain equivalent cell voltages to the other thermal conditions with a similar thermal average of ~20° C., despite an initial electrodeposit that is expected to be highly reversible and less susceptible to reactions with the electrolyte.

Figure 3A:
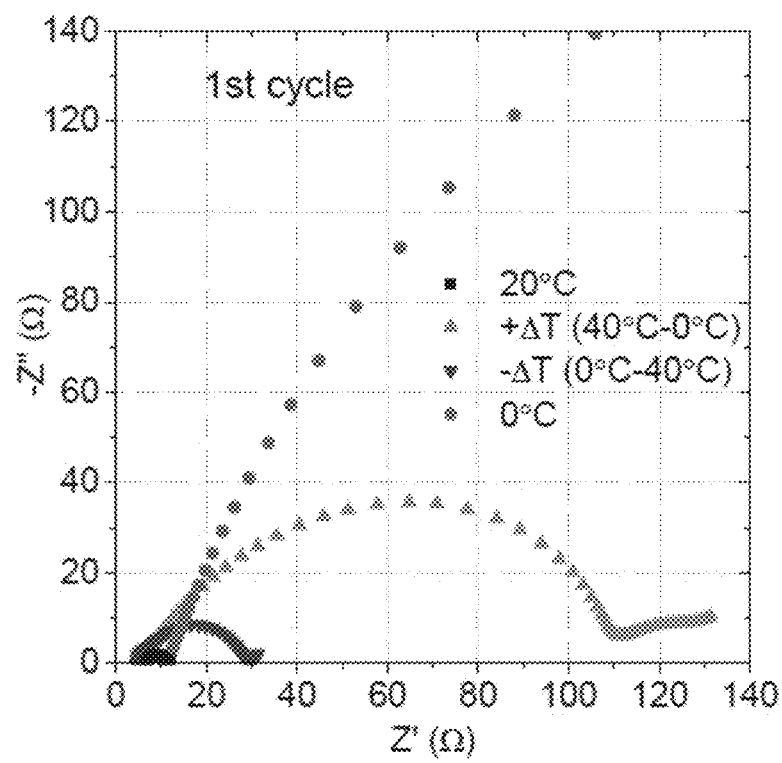
FIGS. 3A-F show Nyquist plots recorded prior to plating on the negative electrode of the symmetric cells for cycle 1 (FIG. 3A), cycle 5 (FIG. 3B), cycle 20 (FIG. 3C), and cycle 50 (FIG. 3D) for the cells cycled at 1.5 mA cm$^{-2}$ to a capacity of 3.0 mAh cm$^{-2}$ with external thermal control.
Figure 3B:
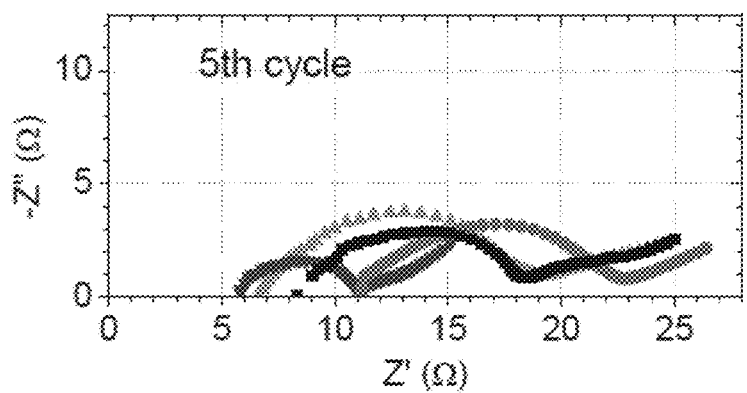

The disadvantage of low temperature is best illustrated by observing behavior of the cell with isothermal 0° C. control, when both electrodes are cooled to 0° C., shown in FIG. 2A. This thermal condition consistently has the highest voltages during cycling, ultimately leading to very large voltage excursions in a single plating or stripping profile—most notable after cycle 40. In the initial cycles, from cycle 1 in FIG. 2B to cycle 5 in FIG. 2C, the voltages decrease significantly, suggesting that the cell is conditioning to a more stable state. This is supported by electrochemical impedance spectra prior to cycles 1 (FIG. 3A) and 5 (FIG. 3B). Isothermal 0° C. control induces very high impedance. It results in the greatest high frequency resistance prior to cycling (FIG. 3A), 12Ω compared to ~5Ω for the other three thermal conditions, from lower ionic mobility and electrolyte conductivity at low temperatures. It also has more than an order of magnitude higher interfacial resistance of 680Ω compared to the other thermal conditions, confirming that cooling both electrodes poses a significant energy barrier for plating and stripping. Having only one cold electrode decreases the interfacial resistance for cells with the two thermal gradient conditions prior to the first plating at the negative electrode, shown in FIG. 3A. Despite an equivalent thermal average for both (~20° C.), cooling the negative electrode to 0° C. nearly triples the interfacial resistance versus the reverse thermal condition. This result indicates that stripping lithium from a warm positive electrode and plating on the cold negative electrode (−ΔT) is a more facile process compared to the reverse, stripping from a cold electrode and plating on a warm electrode (+ΔT). This is critical because, as discussed above, the thermal gradient direction for the very first plating step is the only unique difference between the two types of thermal gradients (+40° C. and −40° C.)—both cells undergo plating and stripping processes at warm and cold electrodes cyclically over the duration of cycling. The initial, relatively low interfacial resistance for cells with the negative thermal gradient is an inaccurate forecast for the ultimate fate of the cell that includes unstable voltage profiles and early cycling termination at cycle 46 from an internal short. The lowest interfacial resistance is observed when the cell is in isothermal control at 20° C., as both electrodes are warm. The temperatures of the electrodes continue to influence plating and stripping through the initial cycles.

Cells with at least one cold electrode benefit from initial cycling by forming electrode surfaces more amenable to Li plating and stripping. The cell voltages decrease for all cells through the first 5 cycles, but this is most apparent by the drastic decrease in cell voltage in early cycles for isothermal 0° C. control, seen from FIGS. 2B to 2C. Cells with cold electrodes decrease the interfacial resistance in initial cycles, from FIGS. 3A to 3B, indicating that plating and stripping become more facile with plating and stripping cycling. This may be related to the difficulty in overcoming the native layer on an electrode when it is cooled to 0° C. This native layer is pristine prior to plating/stripping but would be overcome with cycling to reveal new nucleation sites that may have more favorable surface energetics for lithium electrodeposition (31). The opposite trend in interfacial resistance is observed for isothermal 20° C., highlighting that this thermal condition is unfavorable for lithium plating and stripping. Isothermal 20° C. control, on the other hand, increases interfacial resistance consistently from the very first cycle until the end of the test. This means that the native layer is initially less resistive for a 20° C. electrode (FIG. 3A), but the first several cycles evolve the electrode surfaces into states less favorable for Li plating and stripping. Additionally, the high frequency resistance (HFR) at isothermal 20° C. grows by 60% in the first 4 cycles indicating a decrease in electrolyte conductivity. By contrast, it is stable in the initial cycles for the cells with positive or negative thermal gradients. This trend can be observed in FIG. 3E, which shows evolutions in the HFR with cycle number. The HFR does not change from the first to the 5$^{th}$ cycle for a positive thermal gradient, while it increases by ~30% in this span for isothermal 20° C. control. Similar to the HFR, the interfacial resistance for isothermal 20° C. control also increases consistently in the initial cycles (and through the duration of the test), shown in FIG. 3F. Alternatively, a positive thermal gradient decreases interfacial resistance by an order of magnitude through the first 5 cycles, where it stabilizes at 16Ω, before eventually rising after the 10$^{th}$ plating/stripping cycle.

From cycle 5 to 20 (FIGS. 2C to 2D), the cells transition with unique and significant changes as a function of external thermal control. By cycle 20 (FIG. 2D), the positive thermal gradient clearly emerges as the most stable thermal condition because it is the most effective at minimizing detrimental electrode-electrolyte side reactions. The cell with a positive thermal gradient has the lowest cell voltages and interfacial impedance at cycle 20. Its voltage hysteresis for cycle 20 is 23 mV lower than the cell at isothermal 20° C. control and 133 mV lower than that with negative thermal gradient control. The interfacial resistance for the positive thermal gradient is 23Ω compared to 27 and 40Ω for the isothermal 20° C. and negative thermal gradient controlled cells, respectively. Recalling that its interfacial resistance prior to cycling was an order of magnitude greater than that for isothermal 20° C., repeated plating and stripping with a positive thermal gradient forms electrode surfaces that are more amenable to Li plating and stripping. By diminishing the conversion of plated lithium to electrochemically inactive lithium, freshly deposited Li could repeatedly be plated and stripped across the cell. This reduces the need to overcome large stripping barriers to extract new, previously dormant Li atoms from the excess Li metal in the electrode bulk. Meanwhile, electrochemically inactive Li would be less present at the electrode surface, minimizing mass transport resistances from Li$^+$ ion diffusion.

The hypothesis that a positive thermal gradient reduces Li electrode-electrolyte reactions is consistent with the observation of the lowest HFR by cycle 20 (FIG. 3C) for this thermal condition. A lower HFR would be expected for a cell with a shorter or less tortuous diffusion path for Li$^+$ ions or an electrolyte with higher concentration and conductivity. Electrolyte temperature will also influence the HFR. Prior to cycling, the HFRs were equivalent in the cells with positive and negative thermal gradients, and isothermal 20° C. control, (~6Ω). These three thermal conditions are expected to have similar thermal averages across the cell of ~20° C., so any effect of temperature on the HFR is assumed to be negligible. Differences in the HFR after cycling must be related to internal cell processes occurring to different extents at the different thermal conditions. The HFR will increase in cells that form thick, electrochemically inactive, surface deposits on the electrodes (40) during cycling. Electrolyte ionic conductivity decreases when the effective diffusion path of Li$^+$ ions between electrodes increases due to the formation of tortuous layers of electrochemically inactive Li at the stripping and plating electrodes. Consumption of the electrolyte could also decrease electrolyte conductivity by decreasing the amount of dissociated electrolyte salt ions.

Maintaining a lower HFR is attributed to the effect of the positive thermal gradient of diminishing electrode-electrolyte reactions, minimizing electrolyte consumption, and maintaining higher electrolyte ionic conductivity. Cells with a positive thermal gradient have the smallest growth in interfacial resistance, with an increase of 24% from cycle 5 to 20. The two isothermal conditions maintain the same ordering of interfacial resistances, favoring higher temperature operation at 20° C., but the two conditions have a nearly identical increase in interfacial resistance of ~50%.

Figure 3C:
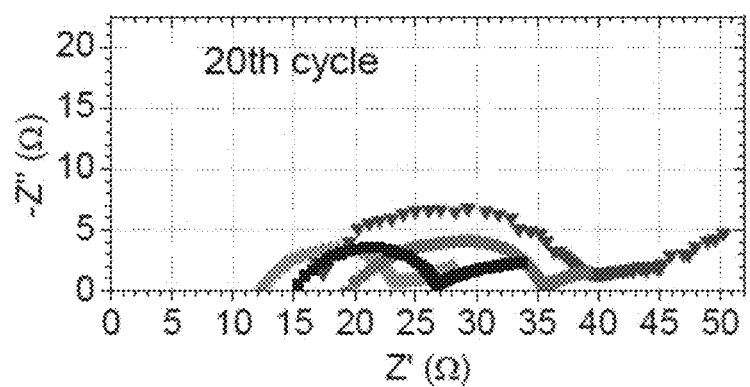
Figure 3D:
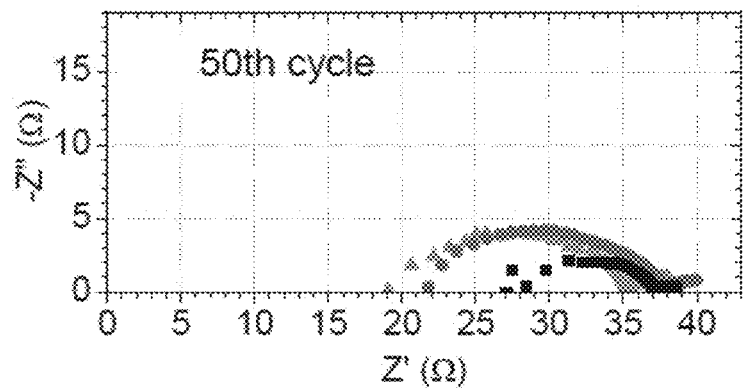
Figure 3E:
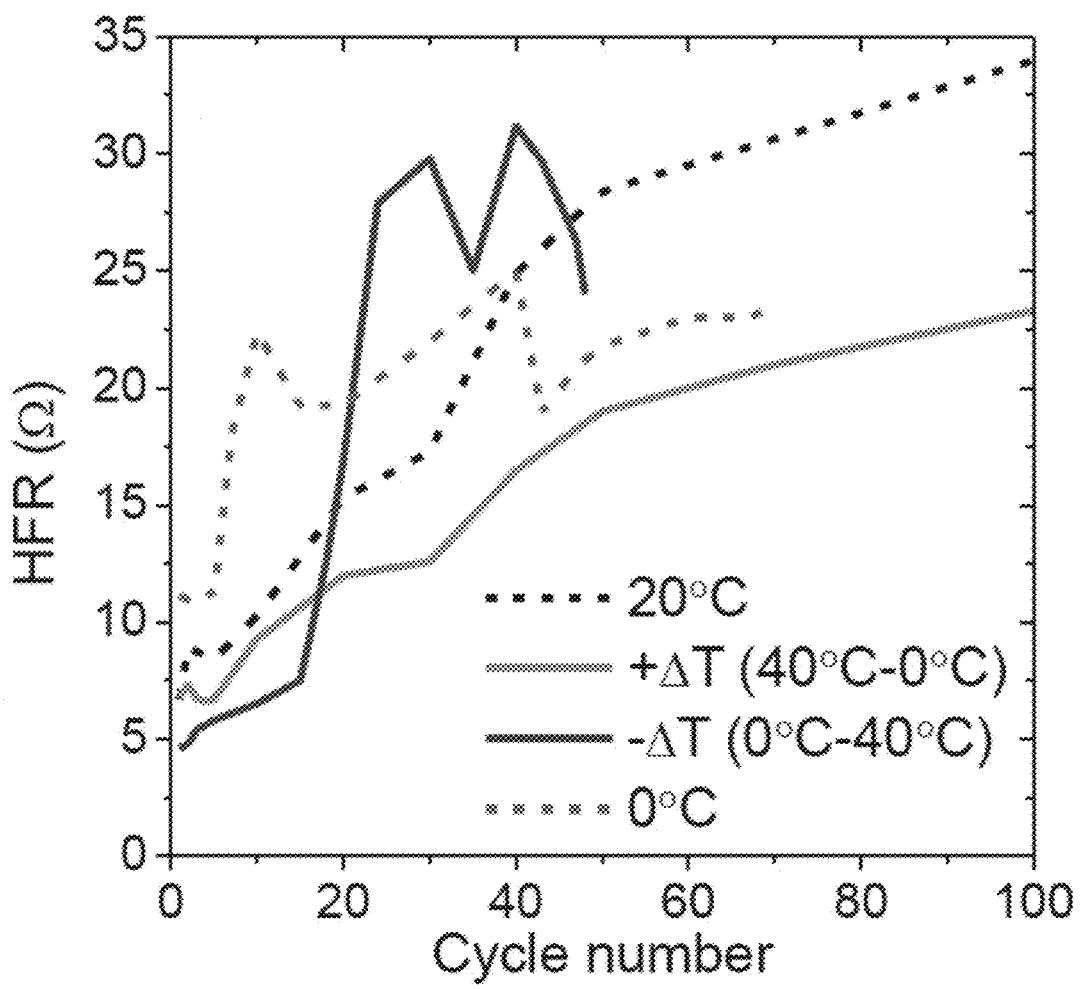
Figure 3F:
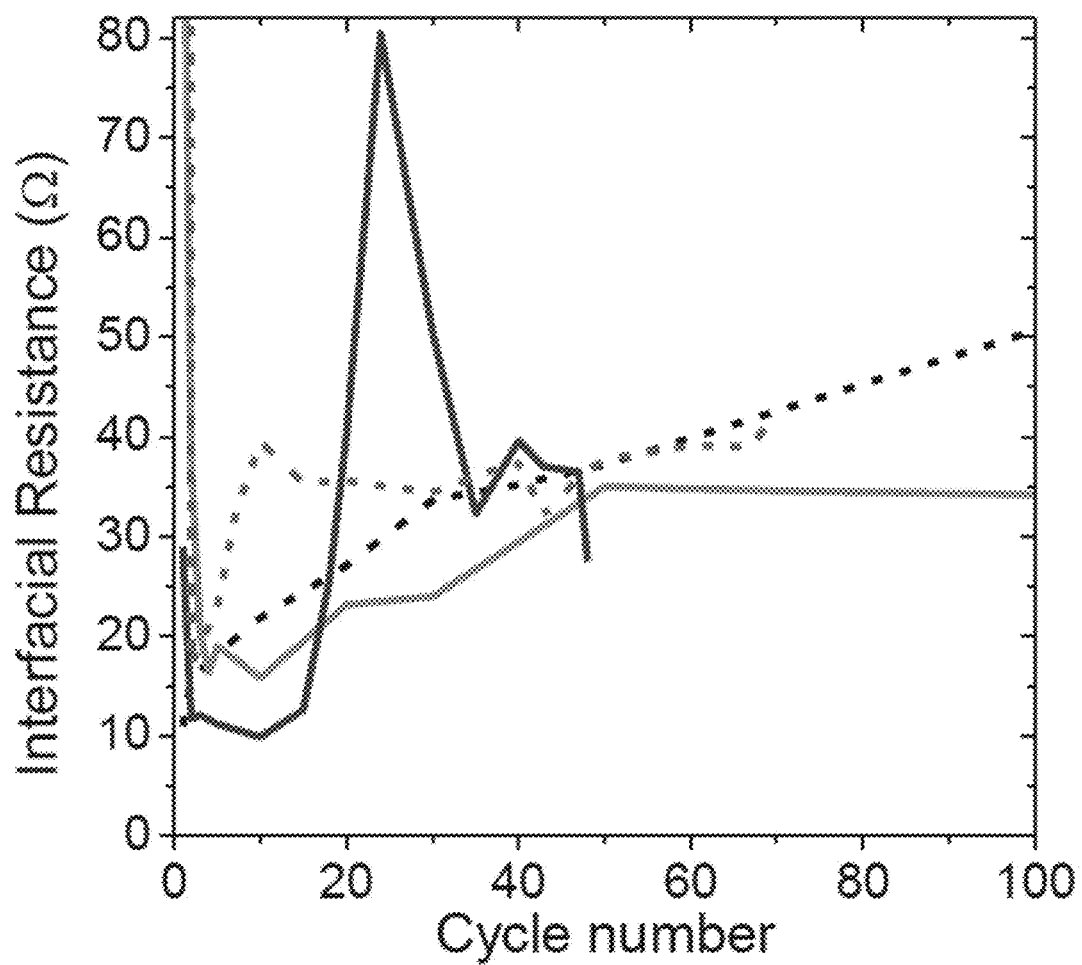

From cycle 5 to 20, the negative thermal gradient dramatically increases cell voltages (FIGS. 2C to 2D), HFR, and interfacial resistances (FIGS. 3B to 3C). The voltage hysteresis for plating and stripping increases from 129 to 284 mV from cycle 5 to 20, which is the largest transition measured in this study in that duration. Most of this hysteresis growth occurs after cycle 12. This corresponds to signatures of rapid degradation in the EIS at cycle 20. The HFR nearly triples (from 6 to 17Ω) and the interfacial resistance increases by 260% in the same span (11 to 40Ω). These are illustrated as drastic increases near 20 cycles in FIGS. 3E and 3F. Each of these observations support deleterious consumption of electroplated Li through reactions with the electrolyte.

Comparing the negative thermal gradient to isothermal 0° C. highlights the disadvantage of heating the incorrect electrode (the positive electrode) that causes unstable plating and stripping and premature termination of cycling by an internal short. Despite its positive electrode being 40° C. warmer than that in isothermal 0° C. control, the latter has a lower interfacial resistance (36Ω) than the negative thermal gradient (40Ω). By the $20^{th}$ cycle, the negative thermal gradient has formed the poorest electrode surfaces for subsequent lithium stripping and electrodeposition. This could be related to a high extent of reactions between plated Li and the electrolyte under these conditions that would consume the plating deposits or electrochemically deactivate them from the rest of the electrode bulk. Evidence of this can be seen in the shape of the plating and stripping voltage profiles for cycle 20 in FIG. 2D. The voltage profiles have the characteristic "peaking" shapes of electrodes with significant stripping and plating barriers. The high cell voltage that decreases to a minimum near 0.5 mAh $cm^{-2}$ is evidence of an initial nucleation barrier to plate Li (38). This would result when much of the electrode surface has reacted with the electrolyte, decreasing the number or quality of lower energy plating sites. This decrease in voltage to a local minimum in the plating profile has also been attributed to the completion of stripping electrochemically active Li from dendrites (41). When the cell voltage rapidly increases from the minimum near 0.5 mAh $cm^{-2}$ to the end of plating at 3.0 mAh $cm^{-2}$ in both the plating and stripping voltage profiles (FIG. 2D), it is an indication that the freshly plated Li at the electrode has been consumed and a new stripping barrier exists for the bulk electrode—previously dormant Li must then be stripped from further into the depths of the bulk Li foil electrode (38, 41). As this process continues over cycling and new Li atoms must be recruited from deeper into the electrode bulk, the $Li^+$ ion diffusion path length between the electrodes increases and the tortuosity of this path increases with the consumption of Li at the electrode surfaces. The effect of this is a decreasing electrolyte conductivity, manifested by the large increase in the HFR in FIG. 3C. The cell with isothermal 0° C. control, which already started with the greatest HFR of all thermal conditions due to reduced ionic conductivity in the cold electrolyte, maintains this distinction prior to cycle 20. However, its interfacial resistance (35Ω) is 13% lower than that of the cell with the negative thermal gradient, which could be related to fewer electrode-electrolyte reactions—thinner SEI are required to passivate the electrode at lower temperatures (29)—and preservation of preferred plating and stripping sites on the electrode surfaces.

All cells destabilize approaching 50 and 100 plating/stripping cycles but the advantage of the positive thermal gradient becomes more apparent because it significantly slows degradation compared to isothermal control. At the $50^{th}$ cycle, shown in FIG. 2E, the same ascending order of voltage hysteresis for positive thermal gradient, isothermal 20° C., and isothermal 0° C. is maintained. A positive thermal gradient reduces voltage hysteresis by 29% compared to isothermal 20° C. at 50 cycles. Consistent with voltage hysteresis, the same ordering of interfacial resistance is also maintained, shown in FIG. 3D. By cycle 50 (FIG. 3D), all cells have growths in both the HFR and interfacial resistance from cycle 20. This can be visualized in FIGS. 3E and 3F for each of these resistances as a function of cycle number, respectively. By the $50^{th}$ cycle, isothermal 0° C. control has a lower HFR than the warmer isothermal 20° C. Extensive electrolyte consumption with cycling at the higher temperature (20° C.) reduces electrolyte conductivity compared to a notorious $Li^+$ ion battery operating condition (0° C.). The final voltage hysteresis at cycle 100 for a positive thermal gradient is 218 mV compared to 320 mV for isothermal 20° C. control; a positive thermal gradient reduces voltage hysteresis by 32% in 100 plating/stripping cycles. Additionally, the voltage hysteresis of an isothermal 20° C. cell at 50 cycles is 120% greater than the hysteresis after 100 cycles for positive thermal gradient control. By this comparison, a positive thermal gradient more than doubles the useable cycle life compared to isothermal control.

Figure 4A:
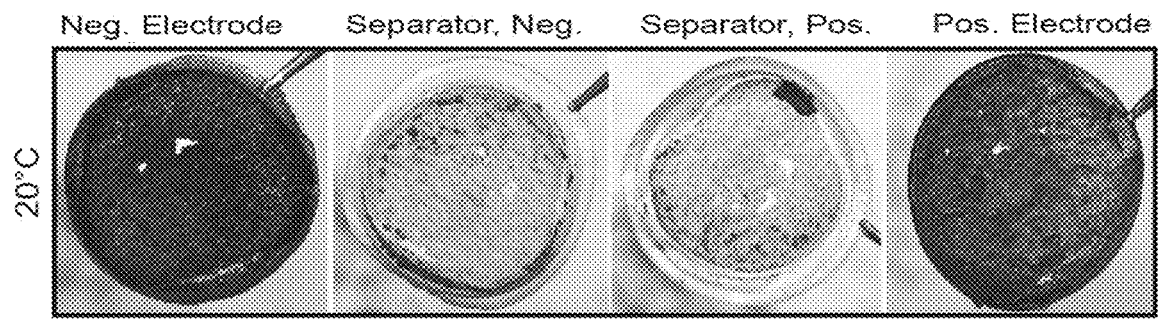
FIGS. 4A-D show photographs of disassembled cell components at end of life after cycling with varying external thermal control: 20° C. (100 cycles, FIG. 4A), positive thermal gradient (40° C. negative electrode, 0° C. positive electrode; 100 cycles, FIG. 4B), negative thermal gradient (0° C. negative electrode, 40° C. positive electrode; 46 cycles, FIG. 4C), and 0° C. (71 cycles, FIG. 4D). Components include, from left to right columns: lithium metal negative electrode, separators facing the negative electrode, separators facing the positive electrode, and lithium metal positive electrode.
Figure 4B:
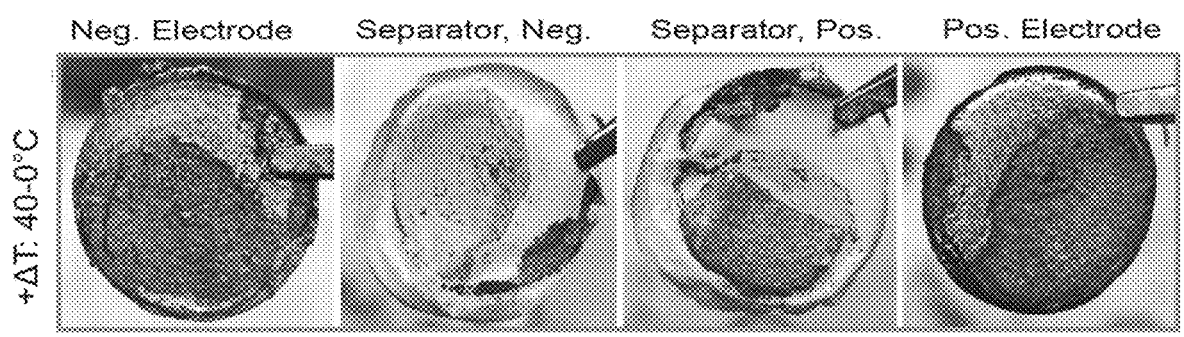
Figure 4C:
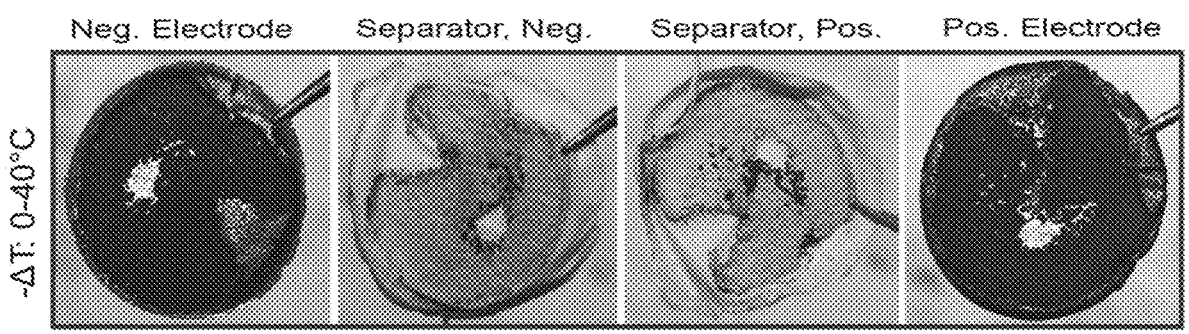
Figure 4D:
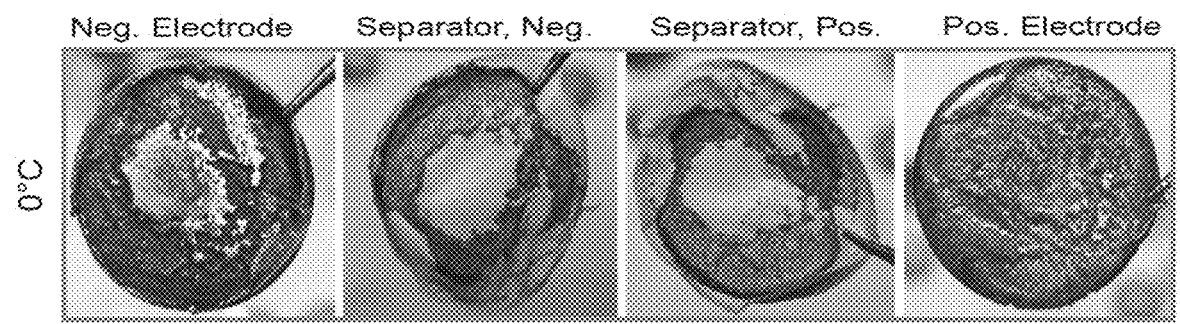
Figure 5A:
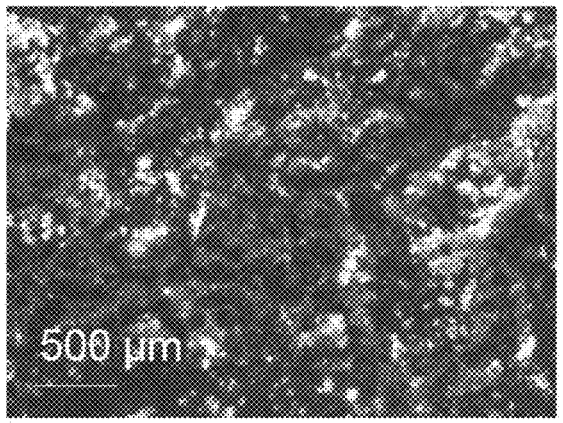
FIGS. 5A-H show optical micrographs at low (1.4×, left column) and high (9.0× right column) magnification of lithium metal negative electrodes at end of life after cycling with external thermal control. 20° C. (100 cycles, FIGS. 5A-B), positive thermal gradient (40° C. negative electrode, 0° C. positive electrode; 100 cycles, FIGS. 5C-D), negative thermal gradient (0° C. negative electrode, 40° C. positive electrode; 46 cycles, FIGS. 5E-F), and 0° C. (71 cycles, FIGS. 5G-H).
Figure 5B:
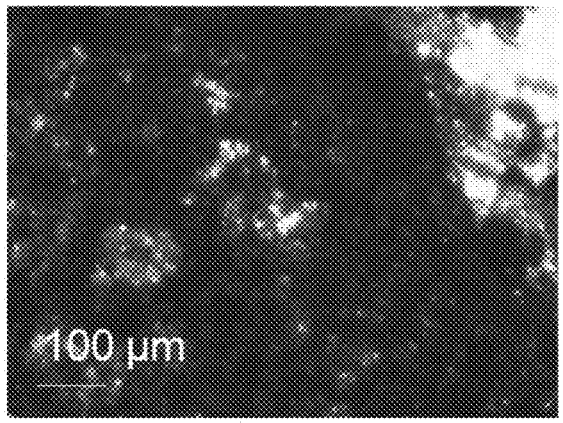
Figure 5C:
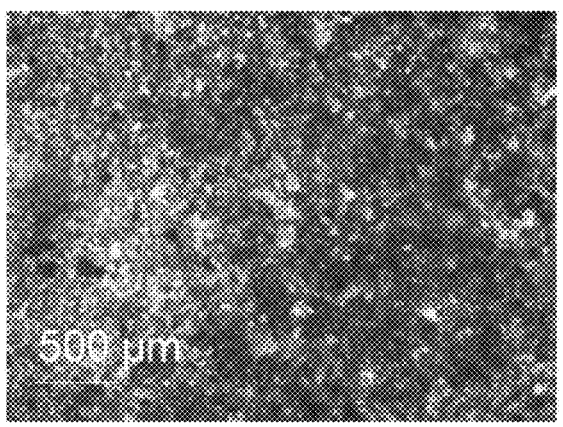
Figure 5D:
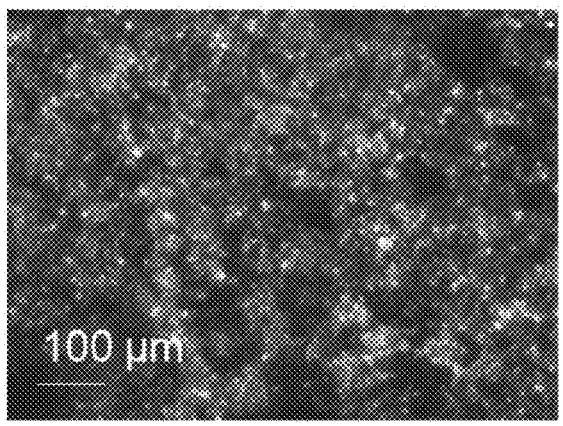
Figure 5E:
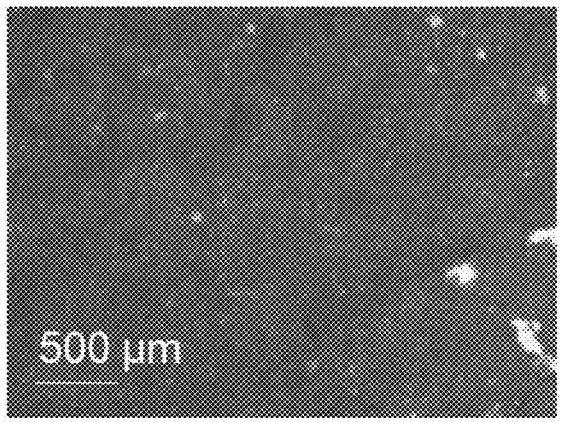
Figure 5F:
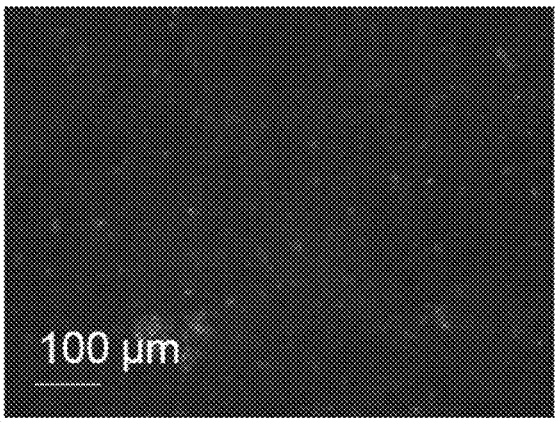
Figure 5G:
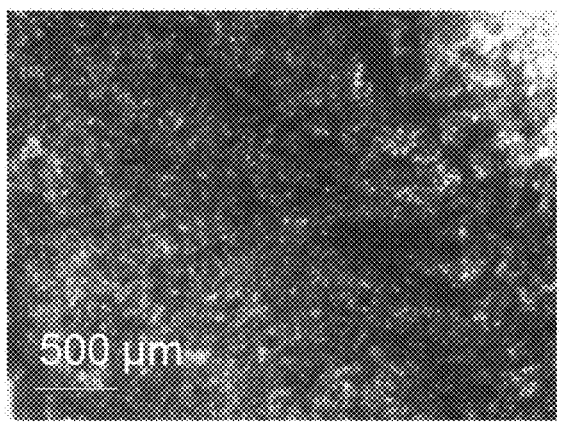
Figure 5H:
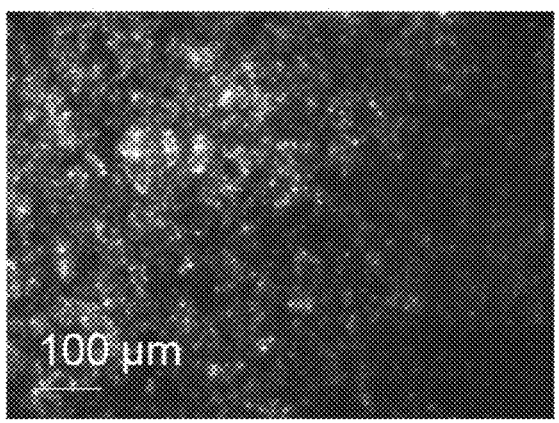

Unaided visual inspection of cell components at the respective end of test points after long-term cycling is shown in FIG. 4, showing distinct differences for the different thermal conditions. Even when cycled with isothermal control of the cell, there are stark variations between negative and positive electrodes as a function of temperature. The negative and positive electrodes from the cell cycled with isothermal 20° C. control (FIG. 4A) are mostly dark gray or black with sparse bright spots, with the dark regions previously attributed to dendrite growth (12, 41) and high-resistance SEI formation (42). This supports conclusions from the electrochemistry data and common reports that electrochemically inactive lithium (black color) builds up on the Li metal surface when it is cycled extensively at ambient temperature (12, 16, 41, 42). Higher magnitude (9.0×) optical micrographs of the negative electrode in FIGS. 5A and 5B show large differences in contrast within the field of view at two magnifications. There is a mix of bright regions (likely electrochemically active, plated metallic lithium) and darker regions (likely electrochemically inactive and isolated lithium). Additionally, significant pitting or variation in surface height is visible on the positive electrode in FIG. 4A, corroborated by dimpling on both sides of the separators that indicates stress from uneven electrode surfaces. Variable electrode height is also prevalent in the cell components cycled with isothermal 0° C. control in FIG. 4D. The negative and positive electrodes from 0° C. cycling have extreme electrode surface height variation, clearly visible without magnification. In FIG. 4D, the negative electrode has a brighter mesa in the center, surrounded by shallower regions closer to the edges. These variations in surface height and surface contrast can also be seen in optical micrographs with higher magnification (FIGS. 5G and 5H). In FIG. 5G, there are distinct regions in the micrograph that are in focus (the darker region in the center of the image) and also out of focus (the bright region in the top right of the image). At lower temperatures, the native layer on the Li metal electrode may have higher plating and stripping barriers, giving rise to preferential plating and stripping regions of the electrode, while other regions of the electrode are dormant. Further, both faces of the separators from the 0° C. show large areas of inhomogeneous, black, electrochemically inactive lithium deposits like that seen on the 20° C. electrodes; in this case, these deposits were inadvertently peeled from the electrodes when the cell was deconstructed.

Lithium metal electrodes cycled with a thermal gradient have remarkably different appearances at end-of-life depending on the direction of the thermal gradient, consistent with observed plating/stripping stability in FIG. 2. Visual inspection of the cell components supports that a positive thermal gradient (FIG. 4B, +ΔT: 40-0° C.) more effectively preserves the metal electrode surfaces. There is much less evidence of electrochemically inactive lithium formation during plating and stripping compared to the other thermal conditions. There are very sparse black deposits on both faces of the separators. The separator faces do, however, contain very thin sheets of lithium metal that have peeled away from the bulk of the electrode during cell deconstruction, with a larger area sheet observed on the positive side of the separators. This could be a result of weakly-adhered lithium plating deposits. Overall, the electrode is dark silver or gray in appearance with less severe observable fluctuations in the electrode surface height to the unaided eye. Higher magnification optical micrographs in FIGS. 5C and 5D show that the negative electrode surface is mostly composed of bright, metallic lithium plating deposits. From the micrographs, it is observed that the Li plating deposits are porous.

Figure 6:
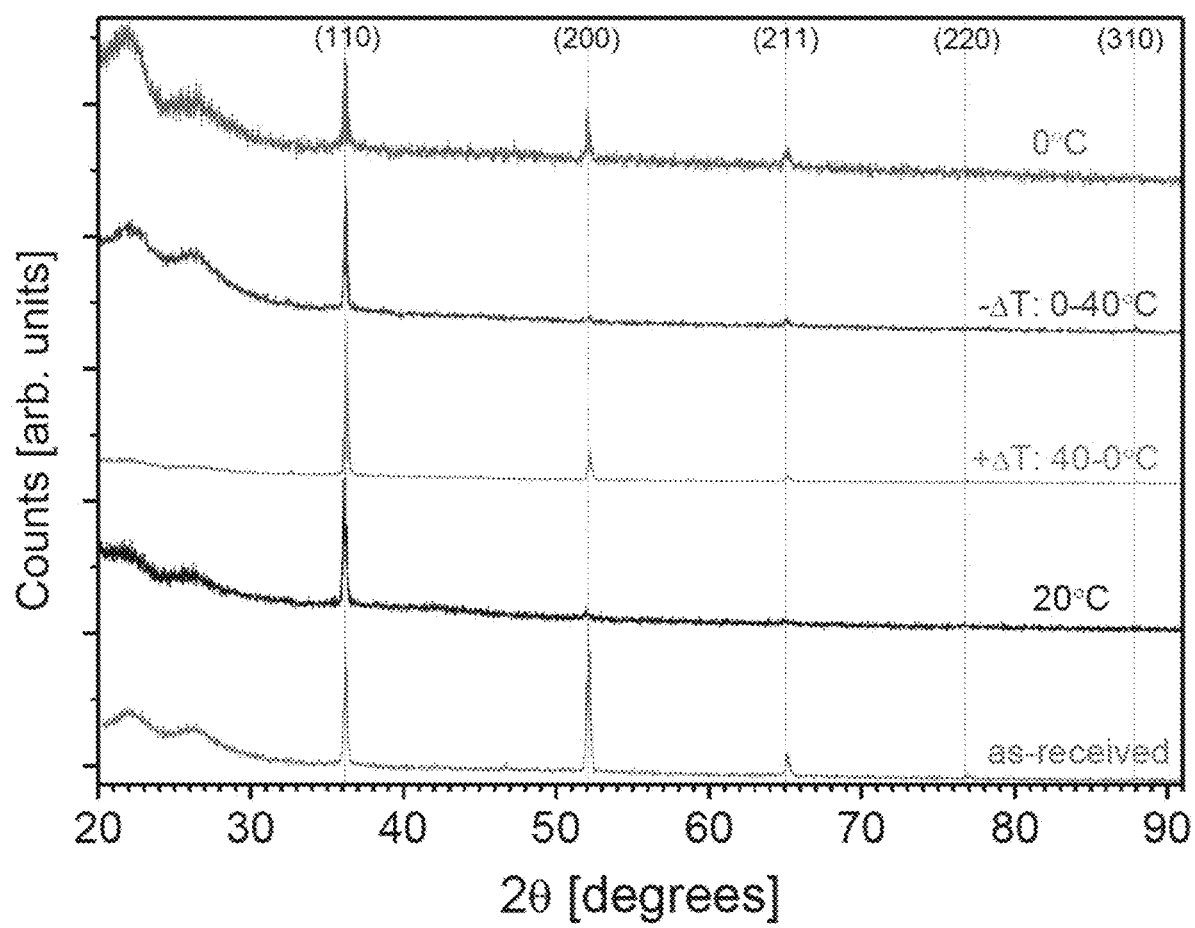
FIG. 6 shows X-ray diffraction patterns of lithium metal negative electrodes as-received and at end of life following cycling with varying external thermal control. Dashed lines correspond to peak locations for metallic lithium (PDF: 01-071-5949). Broad peaks at 2θ less than 30° are from Kapton tape used to seal the sample.

X-ray diffraction patterns for the lithium metal negative electrodes at end-of-life following the long-term cycling experiment are shown in FIG. 6. Amorphous features from the Kapton tape used to seal the electrodes are observed between 20-30° in 2θ. The only other distinct peaks observed in the diffraction patterns are those of body-centered cubic lithium metal. This means that the SEI formed at the surfaces of the electrochemically inactive lithium and any residual electrolyte salt on the electrode surface are either not crystalline or not present in large enough quantities to be detected by this bulk technique. The lithium metal (PDF: 01-071-5949) peak locations are marked with dashed guide lines and indexed at the top axis of the figure. One major difference between the pattern for the electrode with the positive thermal gradient and the electrodes cycled at the other thermal conditions is the relatively higher intensity of the Li$^0$ peaks—especially the Li(110) and Li(200)—compared to the broad features from the Kapton tape (~22° and ~27° in 2θ). This is consistent with visual evidence in FIG. 4 that a positive thermal gradient reduces accumulation of electrochemically inactive or reacted lithium at the electrode surfaces that could suppress lithium metal diffraction by the electrode.

Figure 7A:
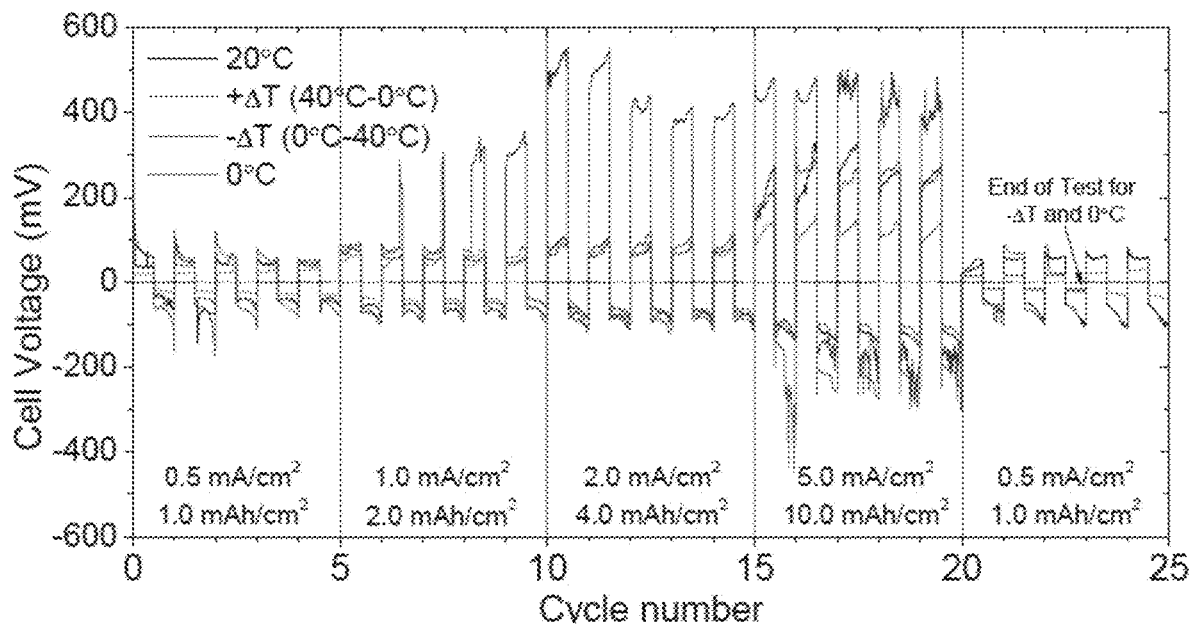
FIG. 7A shows voltage profiles of symmetric lithium metal coin cells to test rate capability with external thermal control. The cells are cycled 5 times each at 0.5, 1.0, 2.0, 5.0, and returned to 0.5 mA cm$^{-2}$ with capacities of 1.0, 2.0, 4.0, 10.0, and 1.0 mAh cm$^{-2}$, respectively.

Applying a positive thermal gradient across the symmetric lithium metal cell improves cycling stability in a broad range of rates and capacities compared to isothermal cell control or the negative thermal gradient. The positive thermal gradient (+ΔT: 40° C. negative electrode, 0° C. positive electrode) lowers plating and stripping voltages, seen in FIG. 7A at each current density (from 0.5 to 5.0 mA cm$^{-2}$) and capacity (from 1.0 to 10.0 mAh cm$^{-2}$). The first ten cycles involve lower current densities (0.5-1.0 mA cm$^{-2}$) and capacities (1.0-2.0 mAh cm$^{-2}$) than those used in the long-term cycling experiment shown in FIG. 2, while cycles greater than 10 meet or exceed the areal capacity of state-of-the-art graphite electrodes (~4 mAh cm$^{-2}$). At the less demanding rates and capacities, the positive thermal gradient reduces plating and stripping overpotentials that results in lower total voltage hysteresis, which is shown as a function of cycle number in FIG. 7C, however, the advantage over isothermal control is small. Neither isothermal operating point, 0° C. nor 20° C., is as effective at reducing cell overpotentials as the positive thermal gradient.

The negative thermal gradient (−ΔT: 0° C. negative electrode, 40° C. positive electrode) has comparable hysteresis to isothermal 20° C. cycling through the first 5 cycles, similar to that observed in FIG. 2A, but begins a transition to unstable behavior in its second cycle at 1.0 mA cm$^{-2}$ (2.0 mAh cm$^{-2}$), 7$^{th}$ cycle total; this is seen as a sharp spike to higher cell voltage at the end of the voltage profile for plating on the negative electrode; the cell voltage increases by more than 150 mV in one minute and sustains this higher overpotential for the remainder of the plating segment. This marks the onset of more significant degradation for the cells with a negative thermal gradient, as each subsequent plating cycle on the negative electrode results in less time at a lower overpotential (~75 mV) and more time at significantly higher overpotential (>290 mV) than the previous cycle. In spite of this unstable plating behavior, the subsequent stripping from the negative electrode does not significantly change from cycle to cycle. The result of this is highly asymmetrical plating and stripping profiles in FIG. 7A. This behavior is consistent for all of the negative thermal gradient cells and is profoundly different from the stable, low voltage plating and stripping of the reversed thermal control (+ΔT: 40° C. negative electrode, 0° C. positive electrode). Similar to its failure mode described in FIG. 2D, the negative thermal gradient voltage profiles have "peaking" shapes in the rate study, indicating a change from stripping Li from freshly plated dendrites to stripping Li from the electrode bulk, the latter requiring a larger energy barrier to strip (38, 41).

The advantage of positive thermal gradient control (+ΔT: 40° C. negative electrode, 0° C. positive electrode) for symmetric lithium metal cells is most significant at the most challenging cycling conditions probed in this study: high rate (5 mA cm$^{-2}$) and high capacity (10 mAh cm$^{-2}$). This occurs between cycle 15 and 20 in FIG. 7A. A positive thermal gradient is the only thermal condition that promotes stable behavior in the 5 cycles at these aggressive plating and stripping conditions. This is also shown in FIG. 7C, where its hysteresis is stable and gradually decreases with cycle number from 15 to 20, with an average hysteresis for the 5 cycles that is 40% lower than that for isothermal 20° C. operation (FIG. 7D). The other thermal conditions cause drastic fluctuations in average hysteresis (−ΔT and 0° C.) or overpotential growth (isothermal 20° C. control) over this course of cycling.

Figure 7B:
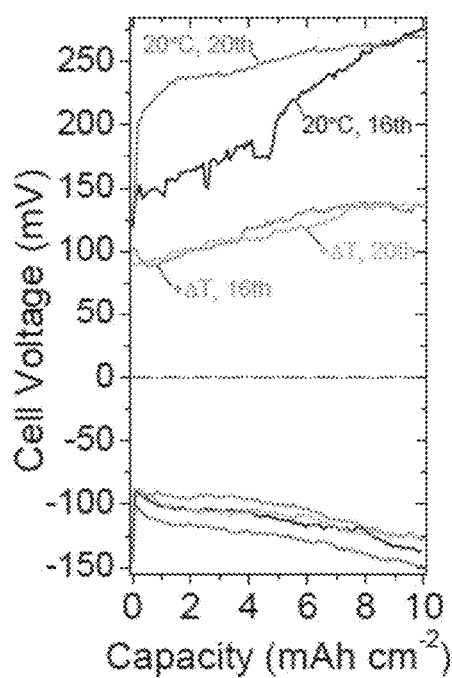
FIG. 7B shows isolated charge and discharge profiles of cycles 16 and 20, the first and last cycles at the highest rates and capacities, for cells at isothermal 20° C. and with a positive thermal gradient (40° C. negative electrode, 0° C. positive electrode).
Figure 7C:
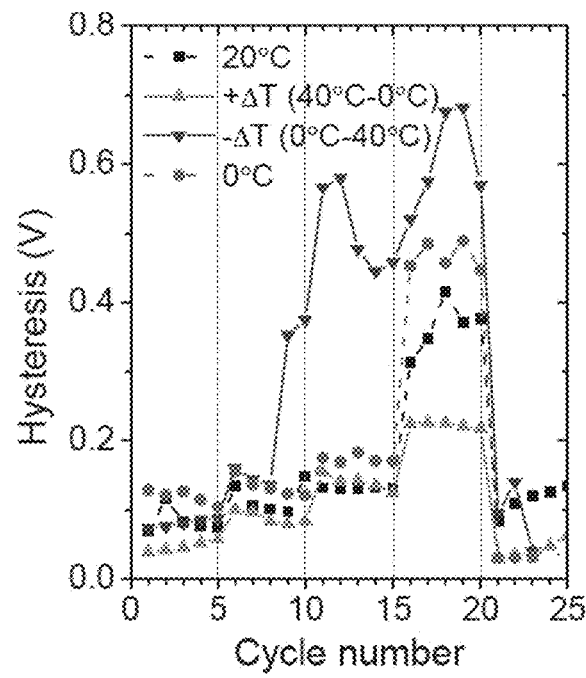
FIG. 7C shows voltage hysteresis comparison of the symmetric cells cycled with different rates and capacities.
Figure 7D:
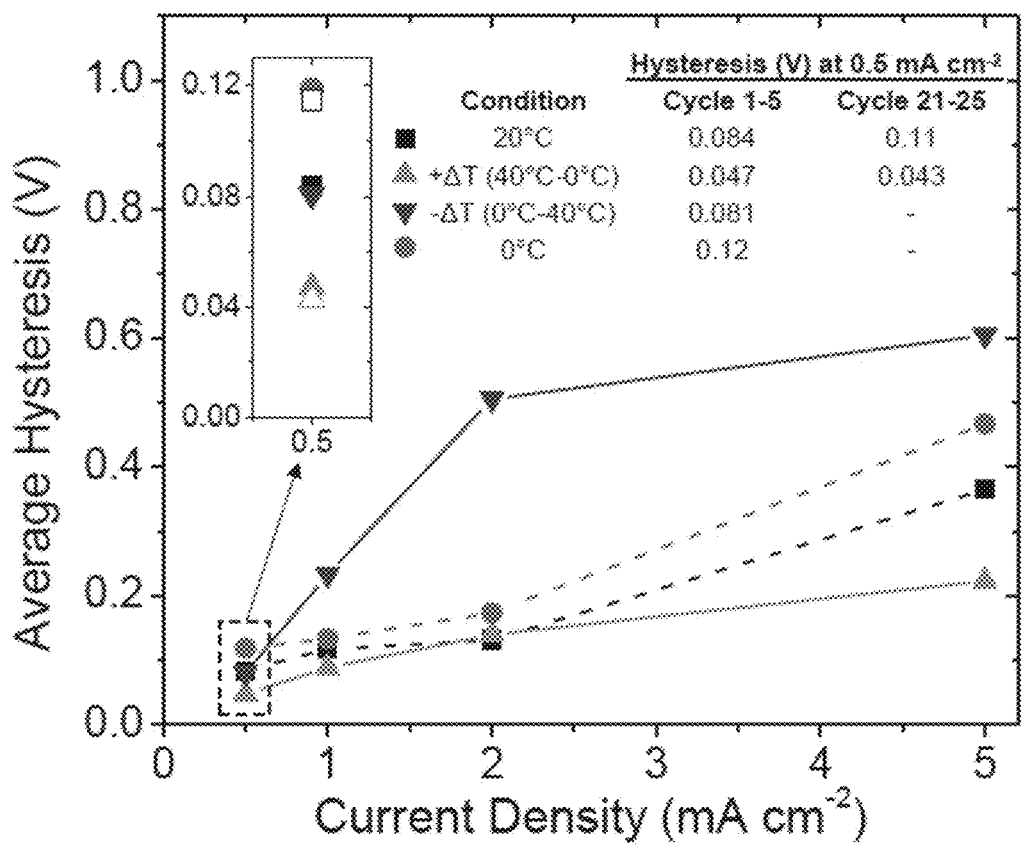
FIG. 7D shows average voltage hysteresis for each set of 5 cycles vs. the respective current density. Isothermal control is represented by a dashed line while thermal gradient control is represented by a solid line. The return to 0.5 mA cm$^{-2}$ for cycles 21 to 25 is represented with an open symbol in the figure inset for comparison to cycles 1-5 (closed symbol); average hysteresis at 0.5 mA cm$^{-2}$ for the set of cycles 1-5 vs. cycles 21-25 is also tabulated in the inset.

A closer inspection of the voltage profiles at 5.0 mA cm$^{-2}$ and 10 mAh cm$^{-2}$, shown in FIG. 7B, reveals a marked transition in the shapes of the plating curves for the isothermal 20° C. Voltage profile evolution over the course of the 5 cycles give insight into the mechanism of its instability. Alternatively, the positive thermal gradient induces more consistent plating and stripping voltage profiles in this range. This matches observations at the lower current densities, where voltage hysteresis decreases with cycles at a given current density. Prior to high-rate plating and stripping in the first 15 cycles, at 0.5, 1.0, and 2.0 mA cm$^{-2}$, the cell cycled at 20° C. has already accumulated a significant amount of electrochemically inactive lithium at the electrode surface. This is evident from the "arcing" behavior observed in the beginning of the plating profile in cycle 16, the first cycle at 5.0 mA cm$^{-2}$, which is observed when excessive amounts of electrochemically inactive lithium deposits are present at the plating electrode and there is a strong lithium ion concentration gradient through the inactive Li layer (10). The radius of curvature of the arc at the onset of the voltage profile increases as the tortuosity of the electrochemically inactive region grows (10). This is the case for the cell cycled at 5.0 mA cm$^{-2}$ at 20° C., as the arc at the initiation of the plating profile grows significantly after 4 cycles (FIG. 7B, 16$^{th}$ to 20$^{th}$ cycle) at high rate and high capacity. Continual growth in ionic concentration gradients in the electrolyte will compound with more cycling and inactive Li formation, exacerbating high-aspect ratio growth in subsequent cycles (31).

In its first plating and stripping at high rate and capacity (16$^{th}$ total cycle), the positive thermal gradient still maintains a "peaking" voltage profile, where the voltage decreases to a "plateau" of low cell voltage before rising again at higher capacity. This suggests there is not a significant mass transport resistance from inactive lithium buildup at these electrodes prior to high-rate cycling. After 4 cycles at 5.0 mA cm$^{-2}$ (10 mAh cm$^{-2}$), the plating and stripping profiles increase linearly. The absence of a well-defined arc at the onset of the stripping profile suggests that these cells still do not suffer from noticeable mass transport effects like the cell with isothermal 20° C. control.

Cell degradation after cycling at isothermal 20° C. is also evident after returning to the low current density and capacity from the first 5 cycles (0.5 mA cm$^{-2}$, 1.0 mAh cm$^{-2}$) after the high-rate cycling for cycles 21-25, shown in the inset of FIG. 7D. The average voltage hysteresis of the first 5 cycles is represented with a closed symbol and the final 5 cycles have open symbols.

The positive thermal gradient reduces average voltage hysteresis by 10% compared to the first 5 cycles. Alternatively, the average voltage hysteresis increases by 37% with cycling with isothermal 20° C. control.

Visualizing the rate capability data in another way in FIG. 7D highlights that symmetric lithium metal cells with isothermal or thermal gradient control behave in categorically different ways as the rate and capacity of lithium plating/stripping increase. Both isothermally controlled cells (0° C. and 20° C.) have a linearly increasing average hysteresis as current density increases to 5 mA cm$^{-2}$ (10.0 mAh cm$^{-2}$). Alternatively, both of the thermal gradient-controlled cells have a logarithmically increasing hysteresis with increasing current density, reaching a plateau at 5.0 mA cm$^{-2}$ (10.0 mAh cm$^{-2}$). As discussed above, a positive thermal gradient (+ΔT: 40° C. negative electrode, 0° C. positive electrode) has the lowest cell voltages at these demanding current densities and capacities tested in this study.

One of the shortcomings of lithium metal electrodes is large volumetric expansion of the electrodes during plating and stripping. It is postulated that by maintaining a flatter electrode surface during cycling, with more uniform, planar plating and stripping across the electrode area, cells with positive thermal gradient control are exposed to more consistent internal stresses between electrode and separator. A cell with large variations in electrode height, like the cells in FIG. 4A and FIG. 4D after isothermal 20° C. and 0° C. control, will experience less uniformity in electrode-separator stresses. This results in regions of high local stress that may fracture or physically detach rough plating deposits from the electrode surface, electrically isolating them from the electrode and exposing fresh Li for SEI formation (4, 11, 38, 43-45). Additionally, the deactivation of Li can exacerbate these internal stresses because inactive lithium at the electrode surface increases the volume of the electrode, as more Li must be recruited from the dense electrode bulk to be plated in inevitably looser deposits at the surface (46). Internal stresses from the separator on non-uniform dendritic growths may also contribute to the black coloration of the electrodes with negative thermal gradient control during plating and stripping (FIG. 4C, −ΔT: 0-40° C.). Continual formations of high-aspect ratio plating growths would increase local stresses when in contact with the separator, which could cause physical detachment from the electrode bulk and a loss of lithium inventory by formation of electrochemically inactive lithium. Black deposits cover the majority of the electrodes with negative thermal gradient, shown in FIG. 4C, with the exception of small areas that may be inactive in plating and stripping, perhaps from a high energy barrier to plating and stripping by the native layer on the electrode. The corresponding optical micrographs in FIGS. 5E and 5F are consistent with these observations.

FIG. 7D allows visualizing the high current density cycling data in a way that identifies striking differences between thermal gradient and isothermal control. Positive thermal gradient control may continue stabilization at even higher current densities (and capacities) than tested in this study, for example, possibly approaching the >10 mA cm$^{-2}$ rate targeted by the United States Department of Energy (DOE) for battery electric vehicles (47). Mass transport resistances reduce as lithium deactivation diminishes with positive thermal gradient control. The onset of a hysteresis plateau for positive thermal gradient control instead of a linear (or exponential) increase at higher current densities in FIG. 7D suggests that plating and stripping may become more efficient, with relatively lower overpotentials than in isothermal control, at higher plating and stripping rates. It is considered that higher current densities will increase joule heating (P=i$^2$R) at the electrodes, raising the temperature of the cold electrode, which will lower the interfacial resistance to lithium plating and stripping (FIG. 3A).

Maintaining lower voltage hysteresis in a broad range of current densities and capacities showcases the promise of positive thermal gradient control for preserving both long cycle life from reducing interfacial reactions with the electrolyte and also enabling high rate plating and stripping. However, it is considered that the electrode temperatures that define the thermal gradient, as well as the magnitude of the thermal gradient itself, have not been optimized for these lithium metal symmetric cells. The simplest way to consider this is that the difference in temperatures between the negative and positive electrodes for the thermal gradient cells is −40° C. (least stable, highest hysteresis) and +40° C. (most stable, lowest hysteresis). This provides only two data points; increasing or decreasing the magnitude of the temperature difference from negative to positive electrode will likely influence plating and stripping uniformity and stability. Alternatively, maintaining the same +40° C. difference from negative to positive electrode but raising the individual electrode temperatures may have significant implications on plating and stripping interfacial resistances. Tuning these independent electrode temperature values and the thermal gradient magnitude may promote even more stable behavior—as has been demonstrated that isothermal 20° C. is more stable than 0° C.—in these challenging cycling conditions.

It is noted that many of the internal cell components chosen for this study are far from optimized and that there may be an even larger potential for improvement from positive thermal gradient control. Ether-based solvents and the lithium nitrate additive were employed in this study, which are shown to promote rounded, spherical Li plating deposits (24). Though spherical electrodeposits are favorable for diminishing high-aspect ratio electrodeposits, it does not result in a dense electrodeposit. The lithium salt choice in this study, LiTFSI, is still prone to porous, "loose" Li plating deposits (8, 19) like those observed here in FIGS. 5C and 5D. However, recent reports show that electrolytes with high Li salt-to-solvent ratios or use of co-solvents that do not solvate Li$^+$ but maintain high miscibility with the solvating solvent can circumvent this and promote denser, lower surface area lithium deposits with lower porosity and lower volume expansion (42, 48, 49). Advances like this in electrolyte formulations, and also electrode materials design, may be extended with positive thermal gradient control. Thermal control can generate a preferred plating deposit morphology and minimize lithium deactivation. In this way, internal cell design can be coupled with operational protocol in a complimentary way, providing a path to robust, rechargeable lithium metal batteries.

Applying external thermal gradients to lithium metal batteries significantly influences plating and stripping stability. The direction of the thermal gradient during the very first Li plating determines whether or not the cell is stable and capable of high-rate, high-capacity plating/stripping or is very unstable and prone to internal shorting. A negative thermal gradient (0° C. negative electrode, 40° C. positive electrode) replicates conditions known to result in high-aspect ratio plating deposits and high surface non-uniformity in the very first Li deposition that predisposes the cell to large cell voltages and consistent, premature failure by internal short circuits. A positive thermal gradient (40° C. negative electrode, 0° C. positive electrode) is an initially high-impedance thermal condition prior to plating, but cold stripping (0° C.) and warm plating (40° C.) forms a uniform initial electrodeposit that predisposes the cell to stable, long-term cycling. This has important implications for cell thermal management strategies; isothermal cell control is not an ideal thermal condition. A positive thermal gradient dramatically reduces cell voltage hysteresis by up to 39% compared to isothermal 20° C. control at very high current density and capacity (5.0 mA cm$^{-2}$ and 10.0 mAh cm$^{-2}$). Positive thermal gradient control emerges as a promising operational strategy for enabling rapid plating/stripping cycle rates targeted by the U.S. DOE.

Obviously, many modifications and variations are possible in light of the above teachings. It is therefore to be understood that the claimed subject matter may be practiced otherwise than as specifically described. Any reference to claim elements in the singular, e.g., using the articles "a", "an", "the", or "said" is not construed as limiting the element to the singular.

REFERENCES

1. M. S. Whittingham, *Proceedings of the IEEE*, 100, 1518 (2012).
2. J.-M. Tarascon and M. Armand, *Nature*, 414, 359 (2001).
3. X. B. Cheng, R. Zhang, C. Z. Zhao and Q. Zhang, *Chem. Rev.*, 117, 10403 (2017).
4. D. Aurbach, E. Zinigrad, Y. Cohen and H. Teller, *Solid State Ionics*, 148, 405 (2002).
5. L. Yu, N. L. Canfield, S. Chen, H. Lee, X. Ren, M. H. Engelhard, Q. Li, J. Liu, W. Xu and J.-G. Zhang, *ChemElectroChem*, 5, 761 (2018).
6. O. O. Taiwo, D. P. Finegan, J. M. Paz-Garcia, D. S. Eastwood, A. J. Bodey, C. Rau, S. A. Hall, D. J. L. Brett, P. D. Lee and P. R. Shearing, *Phys. Chem. Chem. Phys.*, 19, 22111 (2017).
7. D. Rehnlund, C. Ihrfors, J. Maibach and L. Nyholm, *Mater. Today*, 21, 1010 (2018).
8. Y. Li, Z. Yang, Z. Wu, J. Li, J. Zou, C. Jiang, J. Yang, L. Wang and X. Niu, *Solid State Ionics*, 324, 144 (2018).
9. X.-B. Cheng, C. Yan, J.-Q. Huang, P. Li, L. Zhu, L. Zhao, Y. Zhang, W. Zhu, S.-T. Yang and Q. Zhang, *Energy Storage Materials*, 6, 18 (2017).
10. K.-H. Chen, K. N. Wood, E. Kazyak, W. S. LePage, A. L. Davis, A. J. Sanchez and N. P. Dasgupta, *Journal of Materials Chemistry A*, 5, 11671 (2017).
11. D. Lin, Y. Liu and Y. Cui, *Nat Nanotechnol*, 12, 194 (2017).
12. B. Wu, J. Lochala, T. Taverne and J. Xiao, *Nano Energy*, 40, 34 (2017).
13. W. Go, M. Kim, J. Park, C. H. Lim, S. H. Joo, Y. Kim and H. W. Lee, *Nano Lett.* (2018).
14. H. Fan, Q. Dong, C. Gao, B. Hong and Y. Lai, *Mater. Lett.*, 234, 69 (2019).
15. Z. Liang, D. Lin, J. Zhao, Z. Lu, Y. Liu, C. Liu, Y. Lu, H. Wang, K. Yan, X. Tao and Y. Cui, *PNAS*, 113, 2862 (2016).
16. Q. Wang, C. Yang, J. Yang, K. Wu, L. Qi, H. Tang, Z. Zhang, W. Liu and H. Zhou, *Energy Storage Materials*, 15, 249 (2018).
17. J. Xie, J. Wang, H. R. Lee, K. Yan, Y. Li, F. Shi, W. Huang, A. Pei, G. Chen, R. Subbaraman, J. Christensen and Y. Cui, *Science Advances*, 4, 1 (2018).
18. C. Zhao, C. Yu, S. Li, W. Guo, Y. Zhao, Q. Dong, X. Lin, Z. Song, X. Tan, C. Wang, M. Zheng, X. Sun and J. Qiu, *Small*, 14, e1803310 (2018).
19. Y. Li, Y. Sun, A. Pei, K. Chen, A. Vailionis, Y. Li, G. Zheng, J. Sun and Y. Cui, *ACS Cent Sci*, 4, 97 (2018).
20. L. Lin, F. Liang, K. Zhang, H. Mao, J. Yang and Y. Qian, *Journal of Materials Chemistry A*, 6, 15859 (2018).
21. Q. Li, H. Pan, W. Li, Y. Wang, J. Wang, J. Zheng, X. Yu, H. Li and L. Chen, *ACS Energy Letters*, 3, 2259 (2018).
22. H. Ota, K. Shima, M. Ue and J.-i. Yamaki, *Electrochim. Acta*, 49, 565 (2004).
23. Z. Zeng, V. Murugesan, K. S. Han, X. Jiang, Y. Cao, L. Xiao, X. Ai, H. Yang, J.-G. Zhang, M. L. Sushko and J. Liu, *Nature Energy*, 3, 674 (2018).
24. F. Shi, A. Pei, A. Vailionis, J. Xie, B. Liu, J. Zhao, Y. Gong and Y. Cui, *PNAS*, 114, 12138 (2017).
25. K. Park, J. H. Cho, K. Shanmuganathan, J. Song, J. Peng, M. Gobet, S. Greenbaum, C. J. Ellison and J. B. Goodenough, *J. Power Sources*, 263, 52 (2014).
26. Q. Li, S. Tan, L. Li, Y. Lu and Y. He, *Science Advances*, 3, 1 (2017).
27. M. Z. Mayers, J. W. Kaminski and T. F. Miller, *The Journal of Physical Chemistry C*, 116, 26214 (2012).
28. H. Yang, E. O. Fey, B. D. Trimm, N. Dimitrov and M. S. Whittingham, *J. Power Sources*, 272, 900 (2014).
29. A. Heller, *Interface, The Electrochemical Society*, 35 (2013).
30. R. Carter and C. T. Love, *ACS Appl Mater Interfaces* (2018).
31. A. Mistry, C. Fear, R. Carter, C. T. Love and P. P. Mukherjee, *ACS Energy Letters*, 4, 156 (2018).
32. R. Mogi, M. Inaba, Y. Iriyama, T. Abe and Z. Ogumi, *J. Electrochem. Soc.*, 149, A385 (2002).
33. C. T. Love, *J. Power Sources*, 196, 2905 (2011).
34. M. Chatenet, L. Genies-Bultel, M. Aurosseau, R. Durand and F. Andolfatto, *J Appl. Electrochem.*, 32, 1131 (2002).
35. S. C. Nagpure, T. R. Tanim, E. J. Dufek, V. V. Viswanathan, A. J. Crawford, S. M. Wood, J. Xiao, C. C. Dickerson and B. Liaw, *J. Power Sources*, 407, 53 (2018).
36. T. M. Bandhauer, S. Garimella and T. F. Fuller, *J. Electrochem. Soc.*, 158, R1 (2011).
37. C. T. Love, O. A. Baturina and K. E. Swider-Lyons, *ECS Electrochemistry Letters*, 4, A24 (2014).
38. D. Lin, J. Zhao, J. Sun, H. Yao, Y. Liu, K. Yan and Y. Cui, *Proc Natl Acad Sci USA*, 114, 4613 (2017).
39. K. N. Wood, M. Noked and N. P. Dasgupta, *ACS Energy Letters*, 2, 664 (2017).
40. X.-Z. Liao, Z.-F. Ma, Y.-S. He, X.-M. Zhang, L. Wang and Y. Jiang, *J. Electrochem. Soc.*, 152, A1969 (2005).
41. K. N. Wood, E. Kazyak, A. F. Chadwick, K. H. Chen, J. G. Zhang, K. Thornton and N. P. Dasgupta, *ACS Cent Sci*, 2, 790 (2016).

42. J. Qian, W. A. Henderson, W. Xu, P. Bhattacharya, M. Engelhard, O. Borodin and J. G. Zhang, *Nat Commun*, 6, 6362 (2015).
43. H. Zhang, X. Liao, Y. Guan, Y. Xiang, M. Li, W. Zhang, X. Zhu, H. Ming, L. Lu, J. Qiu, Y. Huang, G. Cao, Y. Yang, L. Mai, Y. Zhao and H. Zhang, *Nat Commun*, 9, 3729 (2018).
44. D. Aurbach, E. Zinigrad, H. Teller and P. Dan, *J. Electrochem. Soc.*, 147, 1274 (2000).
45. K. Xu, *Chem. Rev.*, 114, 11503 (2014).
46. J. Liu, Z. Bao, Y. Cui, E. J. Dufek, J. B. Goodenough, P. Khalifah, Q. Li, B. Y. Liaw, P. Liu, A. Manthiram, Y. S. Meng, V. R. Subramanian, M. F. Toney, V. V. Viswanathan, M. S. Whittingham, J. Xiao, W. Xu, J. Yang, X.-Q. Yang and J.-G. Zhang, *Nature Energy* (2019).
47. https://www.energy.gov/eere/vehicles/batteries, in *Batteries*, U. S. Department of Energy Vehicle Technologies Office.
48. S. Chen, J. Zheng, D. Mei, K. S. Han, M. H. Engelhard, W. Zhao, W. Xu, J. Liu and J. G. Zhang, *Adv. Mater.*, 30, e1706102 (2018).
49. X. Ren, S. Chen, H. Lee, D. Mei, M. H. Engelhard, S. D. Burton, W. Zhao, J. Zheng, Q. Li, M. S. Ding, M. Schroeder, J. Alvarado, K. Xu, Y. S. Meng, J. Liu, J.-G. Zhang and W. Xu, *Chem*, 4, 1877 (2018).

What is claimed is:

1. A method of operating a battery comprising:
   providing the battery comprising an anode and a cathode; and
   simultaneously:
   a) maintaining the anode at a first temperature;
   b) maintaining the cathode at a second temperature; and
   c) charging the battery;
   wherein the cathode comprises a coolest portion;
   wherein the anode comprises a warmest portion; and
   wherein the coolest portion of the cathode is at least 1° C. warmer than the warmest portion of the anode;
   wherein the method is performed until growth of metal plating on the anode forms an internal electrical short to the cathode.

2. The method of claim 1, wherein the coolest portion of the cathode is up to 50° C. warmer than the warmest portion of the anode.

3. The method of claim 1, wherein the battery is a lithium ion or lithium metal battery.

4. The method of claim 1, wherein the first temperature is from −10° C. to 5° C.

* * * * *